(12) United States Patent
Uchida et al.

(10) Patent No.: US 10,777,676 B2
(45) Date of Patent: Sep. 15, 2020

(54) SILICON CARBIDE SEMICONDUCTOR DEVICE

(71) Applicant: Sumitomo Electric Industries, Ltd., Osaka-shi (JP)

(72) Inventors: Kosuke Uchida, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/347,255

(22) PCT Filed: Oct. 3, 2017

(86) PCT No.: PCT/JP2017/035921
§ 371 (c)(1),
(2) Date: May 3, 2019

(87) PCT Pub. No.: WO2018/088063
PCT Pub. Date: May 17, 2018

(65) Prior Publication Data
US 2019/0288106 A1 Sep. 19, 2019

(30) Foreign Application Priority Data

Nov. 11, 2016 (JP) .................... 2016-220389

(51) Int. Cl.
*H01L 29/78* (2006.01)
*H01L 29/10* (2006.01)
(Continued)

(52) U.S. Cl.
CPC .......... *H01L 29/7813* (2013.01); *H01L 29/06* (2013.01); *H01L 29/1095* (2013.01);
(Continued)

(58) Field of Classification Search
CPC combination set(s) only.
See application file for complete search history.

(56) References Cited

U.S. PATENT DOCUMENTS 6,518,623 B1 * 2/2003 Oda .................... H01L 29/7834
257/330
9,698,217 B1 * 7/2017 Baba .................... H01L 29/0878
(Continued)

FOREIGN PATENT DOCUMENTS

JP          2015-185751 A      10/2015

*Primary Examiner* — Nduka E Ojeh
(74) *Attorney, Agent, or Firm* — Baker Botts L.L.P.; Michael A. Sartori

(57) ABSTRACT

The side surface has a first outer end surface. The bottom surface has a first bottom portion continuous to the first outer end surface, and a second bottom portion continuous to the first bottom portion and located on a side opposite to the inner end surface with respect to the first bottom portion. A silicon carbide substrate has a first region and a second region located between the at least one gate trench and a second main surface, and spaced from each other with a drift region being sandwiched therebetween. In a direction parallel to the first outer end surface, a spacing between the first region and the second region located between the first bottom portion and the second main surface is smaller than a spacing between the first region and the second region located between the second bottom portion and the second main surface.

16 Claims, 18 Drawing Sheets

(51) Int. Cl.
*H01L 29/16* (2006.01)
*H01L 29/12* (2006.01)
*H01L 29/06* (2006.01)

(52) U.S. Cl.
CPC .......... *H01L 29/12* (2013.01); *H01L 29/1608* (2013.01); *H01L 29/78* (2013.01)

(56) References Cited

U.S. PATENT DOCUMENTS

| | | | |
|---|---|---|---|
| 2008/0173876 A1* | 7/2008 | Ueno | H01L 29/66068 |
| | | | 257/77 |
| 2014/0264564 A1* | 9/2014 | Cheng | H01L 29/66068 |
| | | | 257/330 |
| 2017/0141186 A1* | 5/2017 | Shiomi | H01L 29/7813 |
| 2017/0263757 A1* | 9/2017 | Saikaku | H01L 29/0878 |
| 2018/0277371 A1* | 9/2018 | Nakano | H01L 29/1602 |
| 2019/0198622 A1* | 6/2019 | Uchida | H01L 29/1608 |
| 2019/0237536 A1* | 8/2019 | Hiyoshi | H01L 29/063 |

* cited by examiner

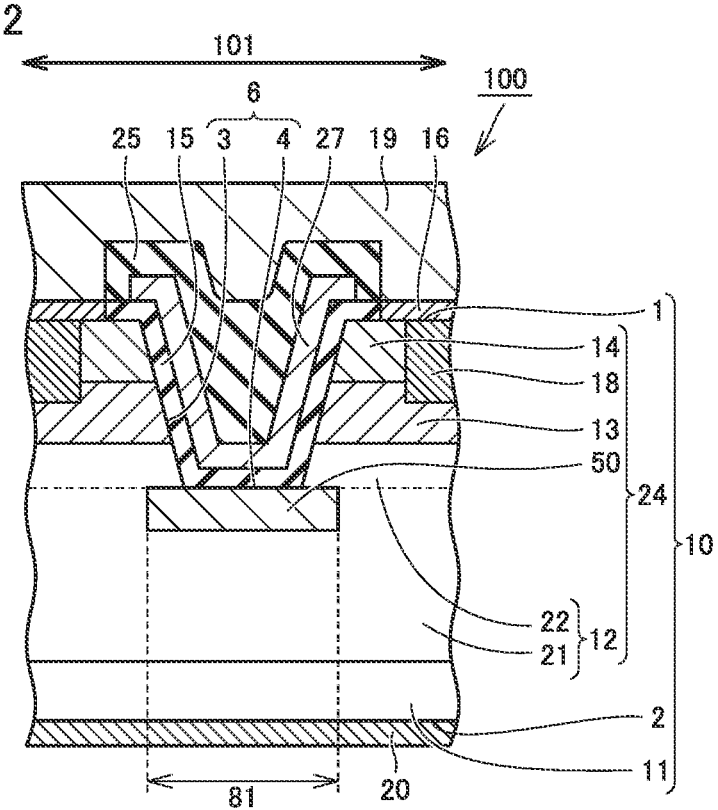

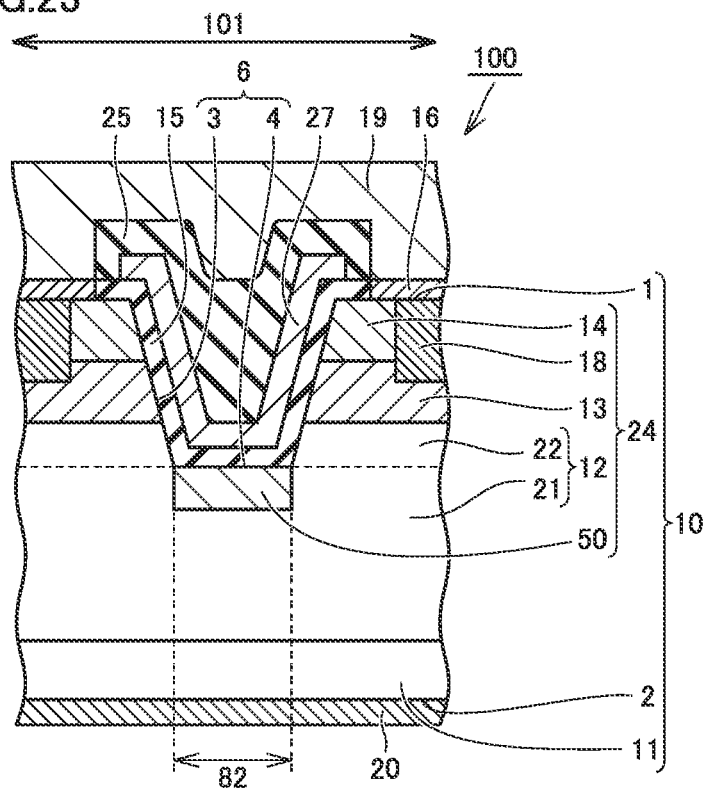
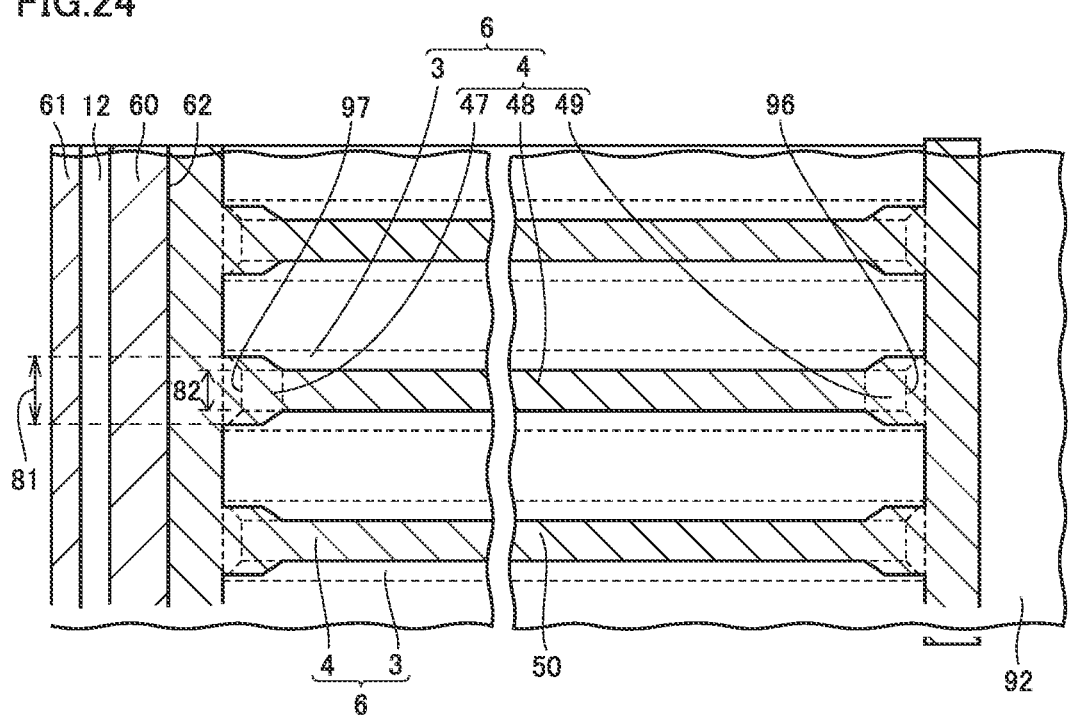

SILICON CARBIDE SEMICONDUCTOR DEVICE

TECHNICAL FIELD

The present disclosure relates to a silicon carbide semiconductor device. The present application claims priority to Japanese Patent Application No. 2016-220389 filed on Nov. 11, 2016, the entire content of which is incorporated herein by reference.

BACKGROUND ART

Japanese Patent Laying-Open No. 2015-185751 (PTD 1) describes a MOSFET (Metal Oxide Semiconductor Field Effect Transistor) capable of depleting an outer peripheral region.

CITATION LIST

Patent Literature

PTL 1: Japanese Patent Laying-Open No. 2015-185751

SUMMARY OF INVENTION

A silicon carbide semiconductor device in accordance with the present disclosure includes a silicon carbide substrate and a gate insulating film. The silicon carbide substrate has a first main surface, and a second main surface located on a side opposite to the first main surface. The gate insulating film is provided on the first main surface. The silicon carbide substrate includes an active region, and a termination region surrounding the active region when viewed from a direction perpendicular to the first main surface. The active region is provided with at least one gate trench defined by a side surface continuous to the first main surface and a bottom surface continuous to the side surface. The active region has: a drift region having a first conductivity type; a body region provided on the drift region and having a second conductivity type different from the first conductivity type; a source region located on the body region, separated from the drift region by the body region, and having the first conductivity type; and a first impurity region located between a plane including the bottom surface and the second main surface, and having the second conductivity type. The termination region includes a second impurity region surrounding the active region when viewed from the direction perpendicular to the first main surface, and having the second conductivity type. The gate insulating film is in contact with the drift region, the body region, and the source region at the side surface, and is in contact with the drift region at the bottom surface. The side surface has a first outer end surface facing an inner end surface of the second impurity region. The bottom surface has a first bottom portion continuous to the first outer end surface, and a second bottom portion continuous to the first bottom portion and located on a side opposite to the inner end surface with respect to the first bottom portion. The first impurity region has a first region and a second region located between the at least one gate trench and the second main surface, and spaced from each other with the drift region being sandwiched therebetween. In a direction parallel to the first outer end surface, a spacing between the first region and the second region located between the first bottom portion and the second main surface is smaller than a spacing between the first region and the second region located between the second bottom portion and the second main surface.

A silicon carbide semiconductor device in accordance with the present disclosure includes a silicon carbide substrate and a gate insulating film. The silicon carbide substrate has a first main surface, and a second main surface located on a side opposite to the first main surface. The gate insulating film is provided on the first main surface. The silicon carbide substrate includes an active region, and a termination region surrounding the active region when viewed from a direction perpendicular to the first main surface. The active region is provided with at least one gate trench defined by a side surface continuous to the first main surface and a bottom surface continuous to the side surface. The active region has: a drift region having a first conductivity type; a body region provided on the drift region and having a second conductivity type different from the first conductivity type; a source region located on the body region, separated from the drift region by the body region, and having the first conductivity type; and a first impurity region located between the bottom surface and the second main surface to face the bottom surface, and having the second conductivity type. The termination region includes a second impurity region surrounding the active region when viewed from the direction perpendicular to the first main surface, and having the second conductivity type. The gate insulating film is in contact with the drift region, the body region, and the source region at the side surface, and is in contact with the drift region at the bottom surface. The side surface has a first outer end surface facing an inner end surface of the second impurity region. The bottom surface has a first bottom portion continuous to the first outer end surface, and a second bottom portion continuous to the first bottom portion and located on a side opposite to the inner end surface with respect to the first bottom portion. In a direction parallel to the first outer end surface, a width of the first impurity region located between the first bottom portion and the second main surface is larger than a width of the first impurity region located between the second bottom portion and the second main surface.

BRIEF DESCRIPTION OF DRAWINGS

FIG. 22 is a schematic cross sectional view showing a configuration of a variation of the silicon carbide semiconductor device in accordance with the second embodiment, and corresponding to a region along line XIX-XIX in FIG. 20.

FIG. 23 is a schematic cross sectional view showing the configuration of the variation of the silicon carbide semiconductor device in accordance with the second embodiment, and corresponding to a region along line XXI-XXI in FIG. 20.

FIG. 24 is a schematic plan view showing the configuration of the silicon carbide semiconductor device in accordance with the second embodiment, and in a region corresponding to region IX in FIG. 8.

DETAILED DESCRIPTION

Summary of Embodiments of Present Disclosure

Figure 1:
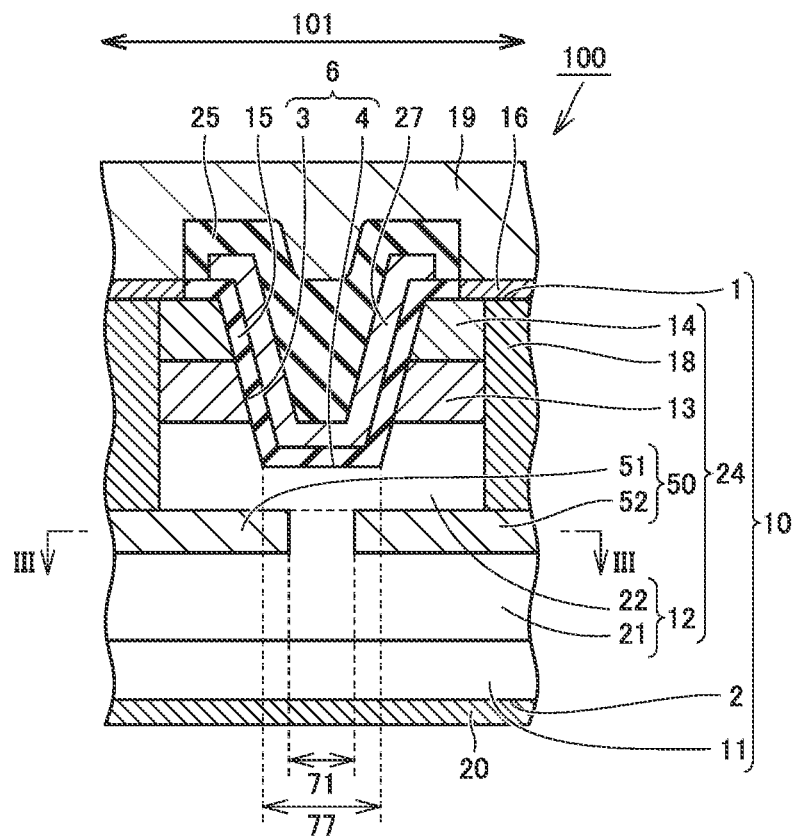
FIG. 1 is a schematic cross sectional view showing a configuration of a silicon carbide semiconductor device in accordance with a first embodiment, and taken along a line I-I in FIG. 3.

First, a summary of embodiments of the present disclosure will be described. Regarding crystallographic indications in the present specification, an individual orientation is represented by [ ], a group orientation is represented by < >, an individual plane is represented by ( ) and a group plane is represented by { }. Generally, a negative index is supposed to be crystallographically indicated by putting "–" (bar) above a numeral, but is indicated by putting the negative sign before the numeral in the present specification.

(1) A silicon carbide semiconductor device 100 in accordance with one aspect of the present disclosure includes a silicon carbide substrate 10 and a gate insulating film 15. Silicon carbide substrate 10 has a first main surface 1, and a second main surface 2 located on a side opposite to first main surface 1. Gate insulating film 15 is provided on first main surface 1. Silicon carbide substrate 10 includes an active region 101, and a termination region 102 surrounding active region 101 when viewed from a direction perpendicular to first main surface 1. Active region 101 is provided with at least one gate trench 6 defined by a side surface 3 continuous to first main surface 1 and a bottom surface 4 continuous to side surface 3. Active region 101 has: a drift region 12 having a first conductivity type; a body region 13 provided on drift region 12 and having a second conductivity type different from the first conductivity type; a source region 14 located on body region 13, separated from drift region 12 by body region 13, and having the first conductivity type; and a first impurity region 50 located between a plane including bottom surface 4 and second main surface 2, and having the second conductivity type. Termination region 102 includes a second impurity region 60 surrounding active region 101 when viewed from the direction perpendicular to first main surface 1, and having the second conductivity type. Gate insulating film 15 is in contact with drift region 12, body region 13, and source region 14 at side surface 3, and is in contact with drift region 12 at bottom surface 4. Side surface 3 has a first outer end surface 31 facing an inner end surface 62 of second impurity region 60. Bottom surface 4 has a first bottom portion 41 continuous to first outer end surface 31, and a second bottom portion 42 continuous to first bottom portion 41 and located on a side opposite to inner end surface 62 with respect to first bottom portion 41. First impurity region 50 has a first region 51 and a second region 52 located between at least one gate trench 6 and second main surface 2, and spaced from each other with drift region 12 being sandwiched therebetween. In a direction parallel to first outer end surface 31, a spacing between first region 51 and second region 52 located between first bottom portion 41 and second main surface 2 is smaller than a spacing between first region 51 and second region 52 located between second bottom portion 42 and second main surface 2.

Since a cell on an outer peripheral side serves as a termination portion where a cell structure ends, an electric field is likely to concentrate thereon, leading to a high electric field intensity, when compared with a cell on an inner peripheral side. According to silicon carbide semiconductor device 100 in accordance with one aspect of the present disclosure, the spacing between first region 51 and second region 52 located between first bottom portion 41 located on the outer peripheral side and second main surface 2 is smaller than the spacing between first region 51 and second region 52 located between second bottom portion 42 located on the inner peripheral side and second main surface 2. By decreasing the spacing between first region 51 and second region 52 on the outer peripheral side having a relatively high electric field intensity, electric field concentration in gate trench 6 can be relieved. On the other hand, by increasing the spacing between first region 51 and second region 52 on the inner peripheral side having a relatively low electric field intensity, a wide current path can be secured and an ON resistance of silicon carbide semiconductor device 100 can be reduced.

(2) In silicon carbide semiconductor device 100 in accordance with (1) described above, a width of first bottom portion 41 in a direction perpendicular to inner end surface 62 may be more than or equal to 50 µm.

(3) In silicon carbide semiconductor device 100 in accordance with (2) described above, the width of first bottom portion 41 in the direction perpendicular to inner end surface 62 may be more than or equal to 100 µm.

(4) In silicon carbide semiconductor device 100 in accordance with (3) described above, the width of first bottom portion 41 in the direction perpendicular to inner end surface 62 may be more than or equal to 150 µm.

(5) Silicon carbide semiconductor device 100 in accordance with any of (1) to (4) described above may further include a gate pad 92 located on active region 101. Side surface 3 may have a second outer end surface 35 facing a first side end surface 94 of gate pad 92. Bottom surface 4 may have a third bottom portion 43 continuous to second outer end surface 35, and a fourth bottom portion 44 continuous to third bottom portion 43 and located on a side opposite to first side end surface 94 with respect to third bottom portion 43. First impurity region 50 may have a third region 53 and a fourth region 54 located between at least one gate trench 6 and second main surface 2, and spaced from each other with drift region 12 being sandwiched therebetween. In a direction parallel to second outer end surface 35, a spacing between third region 53 and fourth region 54 located between third bottom portion 43 and second main surface 2 may be smaller than a spacing between third region 53 and fourth region 54 located between fourth bottom portion 44 and second main surface 2.

Since a cell proximal to gate pad 92 serves as a termination portion where a cell structure ends, an electric field is likely to concentrate thereon, leading to a high electric field intensity, when compared with a cell distal to gate pad 92. According to silicon carbide semiconductor device 100 in accordance with one aspect of the present disclosure, the spacing between third region 53 and fourth region 54 located between third bottom portion 43 proximal to gate pad 92 and second main surface 2 is smaller than the spacing between third region 53 and fourth region 54 located between fourth bottom portion 44 distal to gate pad 92 and second main surface 2. By decreasing the spacing between third region 53 and fourth region 54 at a position proximal to gate pad 92 having a relatively high electric field intensity, electric field concentration in gate trench 6 can be relieved. On the other hand, by increasing the spacing between third region 53 and fourth region 54 at a position distal to gate pad 92 having a relatively low electric field intensity, a wide current path can be secured and the ON resistance of silicon carbide semiconductor device 100 can be reduced.

(6) Silicon carbide semiconductor device 100 in accordance with (5) described above may further include a gate runner 93 electrically connected with gate pad 92. Side surface 3 may have a third outer end surface 39 facing a second side end surface 95 of gate runner 93. Bottom surface 4 may have a fifth bottom portion 45 continuous to third outer end surface 39, and a sixth bottom portion 46 continuous to fifth bottom portion 45 and located on a side opposite to second side end surface 95 with respect to fifth bottom portion 45. First impurity region 50 may have a fifth region 55 and a sixth region 56 located between at least one gate trench 6 and second main surface 2, and spaced from each other with drift region 12 being sandwiched therebetween. In a direction parallel to third outer end surface 39, a spacing between fifth region 55 and sixth region 56 located between fifth bottom portion 45 and second main surface 2 may be smaller than a spacing between fifth region 55 and sixth region 56 located between sixth bottom portion 46 and second main surface 2.

Since a cell proximal to gate runner 93 serves as a termination portion where a cell structure ends, an electric field is likely to concentrate thereon, leading to a high electric field intensity, when compared with a cell distal to gate runner 93. According to silicon carbide semiconductor device 100 in accordance with one aspect of the present disclosure, the spacing between fifth region 55 and sixth region 56 located between fifth bottom portion 45 proximal to gate runner 93 and second main surface 2 is smaller than the spacing between fifth region 55 and sixth region 56 located between sixth bottom portion 46 distal to gate runner 93 and second main surface 2. By decreasing the spacing between fifth region 55 and sixth region 56 at a position proximal to gate runner 93 having a relatively high electric field intensity, electric field concentration in gate trench 6 can be relieved. On the other hand, by increasing the spacing between fifth region 55 and sixth region 56 at a position distal to gate runner 93 having a relatively low electric field intensity, a wide current path can be secured and the ON resistance of silicon carbide semiconductor device 100 can be reduced.

(7) in silicon carbide semiconductor device 100 in accordance with any of (1) to (6) described above, at least one gate trench 6 may include a plurality of gate trenches 6. Each of the plurality of gate trenches 6 may have bottom surface 4 having a rectangular shape. Bottom surface 4 may have a first short edge 97, a second short edge 96 located on a side opposite to first short edge 97, a seventh bottom portion 47 continuous to first short edge 97, an eighth bottom portion 48 continuous to seventh bottom portion 47, and a ninth bottom portion 49 continuous to both eighth bottom portion 48 and second short edge 96. In a direction parallel to first short edge 97, a spacing between first region 51 and second region 52 located between seventh bottom portion 47 and second main surface 2, and a spacing between first region 51 and second region 52 located between ninth bottom portion 49 and second main surface 2 may be smaller than a spacing between first region 51 and second region 52 located between eighth bottom portion 48 and second main surface 2.

(8) In silicon carbide semiconductor device 100 in accordance with any of (1) to (7) described above, active region 101 may further have a third impurity region 70 located between bottom surface 4 and second main surface 2 to face bottom surface 4, and having the second conductivity type.

In the direction parallel to first outer end surface 31, a width of third impurity region 70 located between first bottom portion 41 and second main surface 2 may be larger than a width of third impurity region 70 located between second bottom portion 42 and second main surface 2. By increasing the width of third impurity region 70 on the outer peripheral side having a relatively high electric field intensity, electric field concentration in gate trench 6 can be further relieved.

(9) Silicon carbide semiconductor device 100 in accordance with one aspect of the present disclosure includes silicon carbide substrate 10 and gate insulating film 15. Silicon carbide substrate 10 has first main surface 1, and second main surface 2 located on a side opposite to first main surface 1. Gate insulating film 15 is provided on first main surface 1. Silicon carbide substrate 10 includes active region 101, and termination region 102 surrounding active region 101 when viewed from a direction perpendicular to first main surface 1. Active region 101 is provided with at least one gate trench 6 defined by side surface 3 continuous to first main surface 1 and bottom surface 4 continuous to side surface 3. Active region 101 has: drift region 12 having a first conductivity type; body region 13 provided on drift region 12 and having, a second conductivity type different from the first conductivity type; source region 14 located on body region 13, separated from drift region 12 by body region 13, and having the first conductivity type; and first impurity region 50 located between bottom surface 4 and second main surface 2 to face bottom surface 4, and having the second conductivity type. Termination region 102 includes second impurity region 60 surrounding active region 101 when viewed from the direction perpendicular to first main surface 1, and having the second conductivity type. Gate insulating film 15 is in contact with drift region 12, body region 13, and source region 14 at side surface 3, and is in contact with drift region 12 at bottom surface 4. Side surface 3 has first outer end surface 31 facing inner end surface 62 of second impurity region 60. Bottom surface 4 has first bottom portion 41 continuous to first outer end surface 31, and second bottom portion 42 continuous to first bottom portion 41 and located on a side opposite to inner end surface 62 with respect to first bottom portion 41. In a direction parallel to first outer end surface 31, a width of first impurity region 50 located between first bottom portion 41 and second main surface 2 is larger than a width of first impurity region 50 located between second bottom portion 42 and second main surface 2.

Since a cell on an outer peripheral side serves as a termination portion where a cell structure ends, an electric field is likely to concentrate thereon, leading to a high electric field intensity, when compared with a cell on an inner peripheral side. According to silicon carbide semiconductor device 100 in accordance with one aspect of the present disclosure, the width of first impurity region 50 located between first bottom portion 41 located on the outer peripheral side and second main surface 2 is larger than the width of first impurity region 50 located between second bottom portion 42 located on the inner peripheral side and second main surface 2. By increasing the width of first impurity region 50 on the outer peripheral side having a relatively high electric field intensity, electric field concentration in gate trench 6 can be relieved. On the other hand, by decreasing the width of first impurity region 50 on the inner peripheral side having a relatively low electric field intensity, a wide current path can be secured and the ON resistance of silicon carbide semiconductor device 100 can be reduced.

(10) In silicon carbide semiconductor device 100 in accordance with (9) described above, first impurity region 50 may be in contact with bottom surface 4.

(11) In silicon carbide semiconductor device 100 in accordance with (9) or (10) described above, a width of first bottom portion 41 in a direction perpendicular to inner end surface 62 may be more than or equal to 50 µm.

(12) In silicon carbide semiconductor device 100 in accordance with (11) described above, the width of first bottom portion 41 in the direction perpendicular to inner end surface 62 may be more than or equal to 100 µm.

(13) In silicon carbide semiconductor device 100 in accordance with (12) described above, the width of first bottom portion 41 in the direction perpendicular to inner end surface 62 may be more than or equal to 150 µm.

(14) Silicon carbide semiconductor device 100 in accordance with any of (9) to (13) described above may further include gate pad 92 located on active region 101. Side surface 3 may have second outer end surface 35 facing first side end surface 94 of gate pad 92. Bottom surface 4 may have third bottom portion 43 continuous to second outer end surface 35, and fourth bottom portion 44 continuous to third bottom portion 43 and located on a side opposite to first side end surface 94 with respect to third bottom portion 43. In a direction parallel to second outer end surface 35, a width of first impurity region 50 located between third bottom portion 43 and second main surface 2 may be larger than a width of first impurity region 50 located between fourth bottom portion 44 and second main surface 2.

Since a cell proximal to gate pad 92 serves as a termination portion where a cell structure ends, an electric field is likely to concentrate thereon, leading to a high electric field intensity, when compared with a cell distal to gate pad 92. According to silicon carbide semiconductor device 100 in accordance with one aspect of the present disclosure, the width of first impurity region 50 located between third bottom portion 43 proximal to gate pad 92 and second main surface 2 is larger than the width of first impurity region 50 located between fourth bottom portion 44 distal to gate pad 92 and second main surface 2. By increasing the width of first impurity region 50 at a position proximal to gate pad 92 having a relatively high electric field intensity, electric field concentration in gate trench 6 can be relieved. On the other hand, by decreasing the width of first impurity region 50 at a position distal to gate pad 92 having a relatively low electric field intensity, a wide current path can be secured and the ON resistance of silicon carbide semiconductor device 100 can be reduced.

(15) Silicon carbide semiconductor device 100 in accordance with (14) described above may further include gate runner 93 electrically connected with gate pad 92. Side surface 3 may have third outer end surface 39 facing second side end surface 95 of gate runner 93. Bottom surface 4 may have fifth bottom portion 45 continuous to third outer end surface 39, and sixth bottom portion 46 continuous to fifth bottom portion 45 and located on a side opposite to second side end surface 95 with respect to fifth bottom portion 45. In a direction parallel to third outer end surface 39, a width of first impurity region 50 located between fifth bottom portion 45 and second main surface 2 may be larger than a width of first impurity region 50 located between sixth bottom portion 46 and second main surface 2.

Since a cell proximal to gate runner 93 serves as a termination portion where a cell structure ends, an electric field is likely to concentrate thereon, leading to a high electric field intensity, when compared with a cell distal to gate runner 93. According to silicon carbide semiconductor device 100 in accordance with one aspect of the present disclosure, the width of first impurity region 50 located between fifth bottom portion 45 proximal to gate runner 93 and second main surface 2 is larger than the width of first impurity region 50 located between sixth bottom portion 46 distal to gate runner 93 and second main surface 2. By increasing the width of first impurity region 50 at a position proximal to gate runner 93 having a relatively high electric field intensity, electric field concentration in gate trench 6 can be relieved. On the other hand, by decreasing the width of first impurity region 50 at a position distal to gate runner 93 having a relatively low electric field intensity, a wide current path can be secured and the ON resistance of silicon carbide semiconductor device 100 can be reduced.

(16) In silicon carbide semiconductor device 100 in accordance with any of (9) to (15) described above, at least one gate trench 6 may include a plurality of gate trenches 6. Each of the plurality of gate trenches 6 may have bottom surface 4 having a rectangular shape. Bottom surface 4 may have first short edge 97, second short edge 96 located on a side opposite to first short edge 97, seventh bottom portion 47 continuous to first short edge 97, eighth bottom portion 48 continuous to seventh bottom portion 47, and ninth bottom portion 49 continuous to bath eighth bottom portion 48 and second short edge 96. In a direction parallel to first short edge 97, a width of first impurity region 50 located between seventh bottom portion 47 and second main surface 2, and a width of first impurity region 50 located between ninth bottom portion 49 and second main surface 2 may be larger than a width of first impurity region 50 located between eighth bottom portion 48 and second main surface 2.

Details of Embodiments of Present Disclosure

Hereinafter, details of embodiments of the present disclosure will be described with reference to the drawings. It should be noted that, in the following drawings, identical or corresponding parts will be designated by the same reference numerals, and the description thereof will not be repeated.

First Embodiment

First, a configuration of a MOSFET as an example of a silicon carbide semiconductor device in accordance with a first embodiment of the present disclosure will be described.

As shown in FIG. 1, MOSFET 100 in accordance with the first embodiment mainly has silicon carbide substrate 10, gate insulating film 15, a gate electrode 27, an interlayer insulating film 25, a source electrode 16, a source wire 19, and a drain electrode 20. Silicon carbide substrate 10 includes a silicon carbide single crystal substrate 11, and a silicon carbide epitaxial layer 24 provided on silicon carbide single crystal substrate 11. Silicon carbide substrate 10 has first main surface 1, and second main surface 2 located on a side opposite to first main surface 1. Silicon carbide epitaxial layer 24 constitutes first main surface 1. Silicon carbide single crystal substrate 11 constitutes second main surface 2.

First main surface 1 is, for example, a {000-1} plane, or a plane angled off relative to the {000-1} plane by more than or equal to 2° and less than or equal to 8°. Specifically, first main surface 1 is a (000-1) plane, or a plane angled off relative to the (000-1) plane by more than or equal to 2° and less than or equal to 8°. Silicon carbide single crystal substrate 11 and silicon carbide epitaxial layer 24 are hexagonal crystal silicon carbide having a polytype of 4H, for example. Silicon carbide single crystal substrate 11 contains an n type impurity such as nitrogen, for example, and has an n type conductivity type (first conductivity type).

Figure 2:
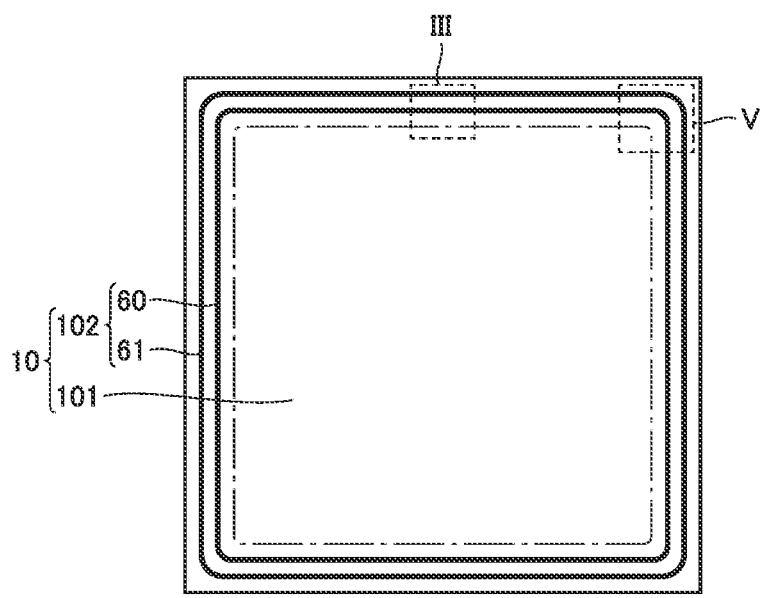
FIG. 2 is a schematic plan view showing the configuration of the silicon carbide semiconductor device in accordance with the first embodiment.

As shown in FIG. 2, silicon carbide substrate 10 includes active region 101 and termination region 102. Termination region 102 surrounds active region 101 when viewed from a direction perpendicular to first main surface 1. In other words, termination region 102 is located on the outside of active region 101 when viewed from the direction perpendicular to first main surface 1. Termination region 102 mainly includes second impurity region 60 and a guard ring 61. Second impurity region 60 is a JTE (Junction Termination Extension), for example. Second impurity region 60 may be a guard ring. Second impurity region 60 surrounds active region 101 when viewed from the direction perpendicular to first main surface 1.

As shown in FIG. 1, active region 101 mainly includes drift region 12, first impurity region 50, body region 13, source region 14, and a contact region 18. Drift region 12 contains an n type impurity such as nitrogen, for example, and has the n type conductivity type (the first conductivity type). Drift region 12 has a first drift region portion 21 and a second drift region portion 22. The concentration of the n type impurity in first drift region portion 21 is about $7 \times 10^{15}$ cm$^{-3}$, for example. The concentration of the n type impurity in silicon carbide single crystal substrate 11 may be higher than the concentration of the n type impurity in first drift region portion 21.

Second drift region portion 22 is continuous to first drift region portion 21. The concentration of the n type impurity in second drift region portion 22 may be higher than the concentration of the n type impurity in first drift region portion 21, or may be substantially the same as the concentration of the n type impurity in first drift region portion 21. The concentration of the n type impurity in second drift region portion 22 is about $3 \times 10^{16}$ cm$^{-3}$, for example. Second drift region portion 22 is located on first drift region portion 21 and first impurity region 50. A bottom surface of second drift region portion 22 is in contact with top surfaces of first drift region portion 21 and first impurity region 50.

Body region 13 is located on second drift region portion 22. Body region 13 is in contact with second drift region portion 22. Body region 13 contains a p type impurity such as aluminum, for example, and has a p type conductivity type (a second conductivity type). A channel can be formed in a region of body region 13 facing gate insulating film 15.

Source region 14 is located on body region 13. Source region 14 is in contact with body region 13. Source region 14 is separated from second drift region portion 22 by body region 13. Source region 14 contains an n type impurity such as nitrogen or phosphorus, for example, and has the n type conductivity type. Source region 14 constitutes a portion of first main surface 1 of silicon carbide substrate 10. The concentration of the n type impurity in source region 14 may be higher than the concentration of then type impurity in second drift region portion 22.

Contact region 18 is in contact with body region 13 and source region 14. Contact region 18 contains a p type impurity such as aluminum, for example, and has the p type conductivity type. The concentration of the p type impurity contained in contact region 18 may be higher than the concentration of the p type impurity contained in body region 13. Contact region 18 connects body region 13 and first main surface 1. Contact region 18 may penetrate through source region 14 and body region 13, and may be in contact with second drift region portion 22. Contact region 18 may extend to first impurity region 50. By adopting a structure in which first impurity region 50 is grounded to contact region 18, the potential of first impurity region 50 is fixed, and thereby electrostatic capacity fluctuation can be suppressed.

First main surface 1 of silicon carbide substrate 10 is provided with gate trench 6 defined by side surface 3 and bottom surface 4. Specifically, active region 101 is provided with at least one gate trench 6 defined by side surface 3 continuous to first main surface 1 and bottom surface 4 continuous to side surface 3. Side surface 3 penetrates through body region 13 and source region 14, and reaches second drift region portion 22. Bottom surface 4 is located in second drift region portion 22.

Side surface 3 may be inclined such that the width of gate trench 6 tapers down toward bottom surface 4 when viewed in cross section (a field of view seen from a direction parallel to second main surface 2). For example, side surface 3 is inclined relative to the (000-1) plane by more than or equal to 52° and less than or equal to 72°. Side surface 3 may be substantially perpendicular to first main surface 1. Bottom surface 4 may be substantially parallel to first main surface 1. Gate trench 6 may have a U or V shape when viewed in cross section. Source region 14 and body region 13 are exposed at side surface 3 of gate trench 6. Second drift region portion 22 is exposed at both of side surface 3 and bottom surface 4 of gate trench 6.

Gate insulating film 15 is provided on silicon carbide substrate 10. Gate insulating film 15 is a thermal oxidation film, for example. Gate insulating film 15 is made of a material containing silicon dioxide, for example. The thickness of gate insulating film 15 is about 45 nm, for example. Gate insulating film 15 is in contact with source region 14, body region 13, and second drift region portion 22 at side surface 3. Gate insulating film 15 is in contact with second drift region portion 22 at bottom surface 4. Gate insulating film 15 may be in contact with source region 14 at first main surface 1.

Gate electrode 27 is provided on gate insulating film 15 inside gate trench 6. Gate electrode 27 is made of polysilicon containing an impurity, for example. Gate electrode 27 is provided to face source region 14, body region 13, and second drift region portion 22. Gate insulating film 15 is provided between body region 13 and gate electrode 27.

Source electrode 16 is in contact with source region 14 and contact region 18 at first main surface 1. Source electrode 16 is made of a material containing Ti, Al, and Si, for example. Preferably, source electrode 16 is in ohmic junction with source region 14 and contact region 18. Source wire 19 is in contact with source electrode 16. Source wire 19 is made of a material containing aluminum, for example.

Interlayer insulating film 25 is provided in contact with gate electrode 27 and gate insulating film 15. Interlayer insulating film 25 is made of a material containing silicon dioxide, for example. Interlayer insulating film 25 may be provided on gate electrode 27 inside gate trench 6. Interlayer insulating film 25 electrically insulates source electrode 16 from gate electrode 27. Drain electrode 20 is in contact with silicon carbide single crystal substrate 11 at second main surface 2. Drain electrode 20 is electrically connected with drift region 12. Drain electrode 20 is made of a material containing NiSi or TiAlSi, for example.

As shown in FIG. 1, first impurity region 50 is located between a plane including bottom surface 4 and second main surface 2. First impurity region 50 contains a p type impurity such as aluminum, for example, and has the p type conductivity type. The concentration of the p type impurity in first impurity region 50 is more than or equal to $5 \times 10^{16}$ cm$^{-3}$ and less than or equal to $1 \times 10^{18}$ cm$^{-3}$, for example. First impurity region 50 has first region 51 and second region 52 located between at least one gate trench 6 and second main surface 2, and spaced from each other with drift region 12 being sandwiched therebetween. A portion of first drift region portion 21 is located between first region 51 and second region 52.

Second impurity region 60 contains a p type impurity such as aluminum, for example, and has the p type conductivity type. Second impurity region 60 is a JTE, for example. The concentration of the p type impurity in second impurity region 60 is more than or equal to $5 \times 10^{16}$ cm$^{-3}$ and less than or equal to $1 \times 10^{18}$ cm$^{-3}$, for example. The concentration of the n type impurity or the p type impurity in each impurity region described above can be measured by SIMS (Secondary ion Mass Spectrometry), for example.

Figure 3:
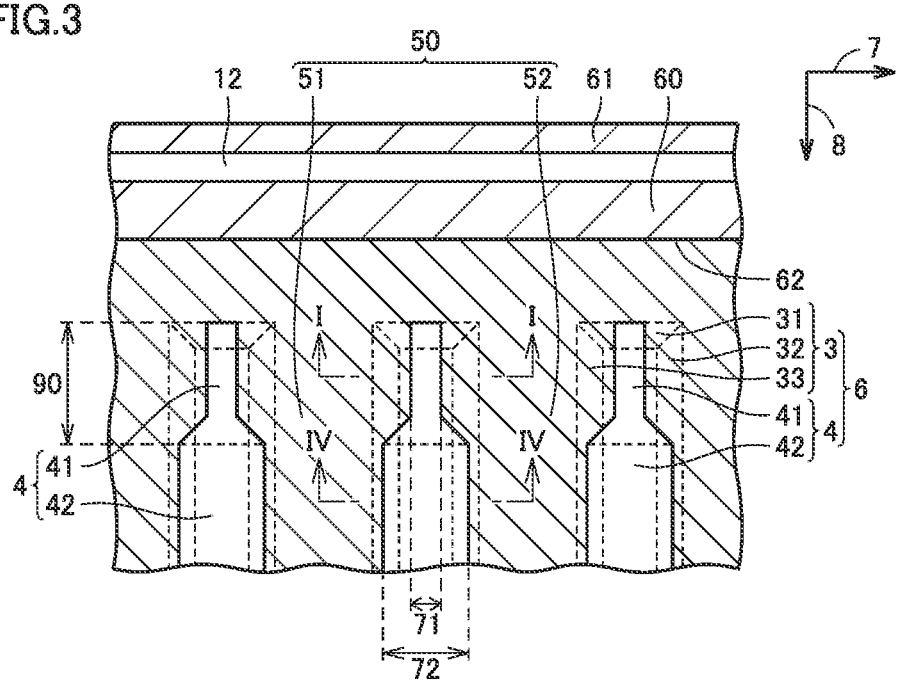
FIG. 3 is an enlarged view of a region III in FIG. 2.

As shown in FIG. 3, second impurity region 60 has inner end surface 62 facing the active region. Side surface 3 of gate trench 6 has first outer end surface 31 facing inner end surface 62. First outer end surface 31 may be a surface closest to inner end surface 62 of second impurity region 60, in side surface 3 of gate trench 6. Bottom surface 4 has first bottom portion 41 and second bottom portion 42. First bottom portion 41 is continuous to first outer end surface 31. Second bottom portion 42 is continuous to first bottom portion 41, and is located on a side opposite to inner end surface 62 with respect to first bottom portion 41. As shown in FIG. 3, in a direction 7 parallel to first outer end surface 31, a spacing 71 between first region 51 and second region 52 located between first bottom portion 41 and second main surface 2 is smaller than a spacing 72 between first region 51 and second region 52 located between second bottom portion 42 and second main surface 2.

Figure 4:
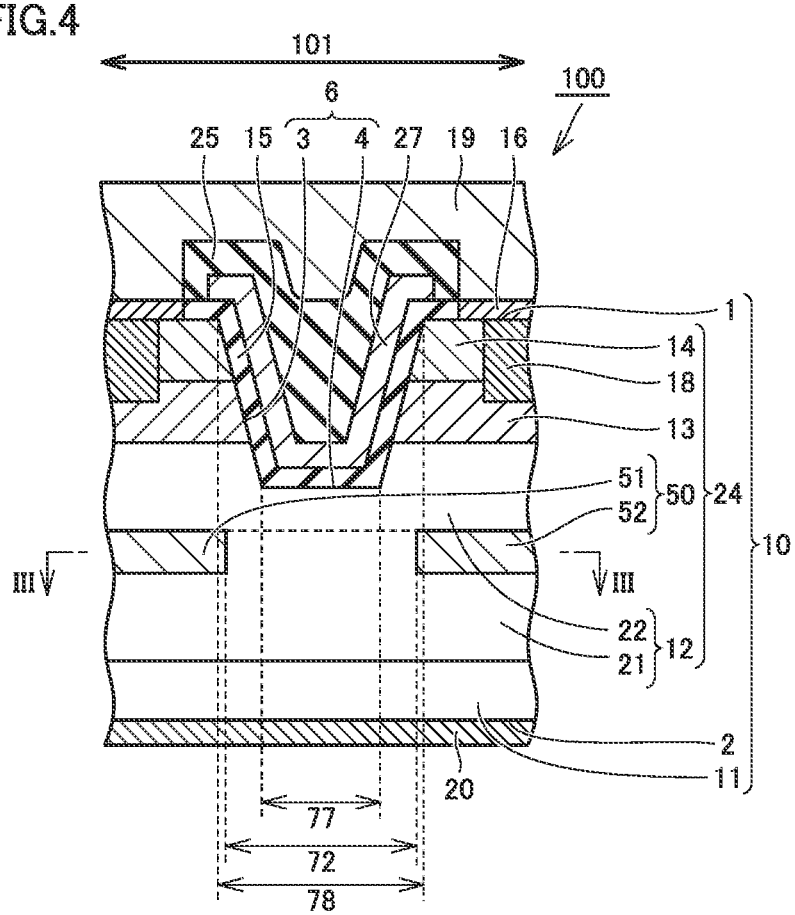
FIG. 4 is a schematic cross sectional view showing the configuration of the silicon carbide semiconductor device in accordance with the first embodiment, and taken along a line IV-IV in FIG. 3.

As shown in FIGS. 1 and 3, spacing 71 between first region 51 and second region 52 located between first bottom portion 41 and second main surface 2 may be smaller than a width 77 of first bottom portion 41. As shown in FIGS. 3 and 4, spacing 72 between first region 51 and second region 52 located between second bottom portion 42 and second main surface 2 may be larger than width 77 of second bottom portion 42 and smaller than a width 78 of an opening in gate trench 6. A width 90 of first bottom portion 41 in a direction 8 perpendicular to inner end surface 62 (see FIG. 3) is more than or equal to 50 μm, for example. Width 90 of first bottom portion 41 in the direction perpendicular to inner end surface 62 may be more than or equal to 100 μm, or may be more than or equal to 150 μm.

Figure 5:
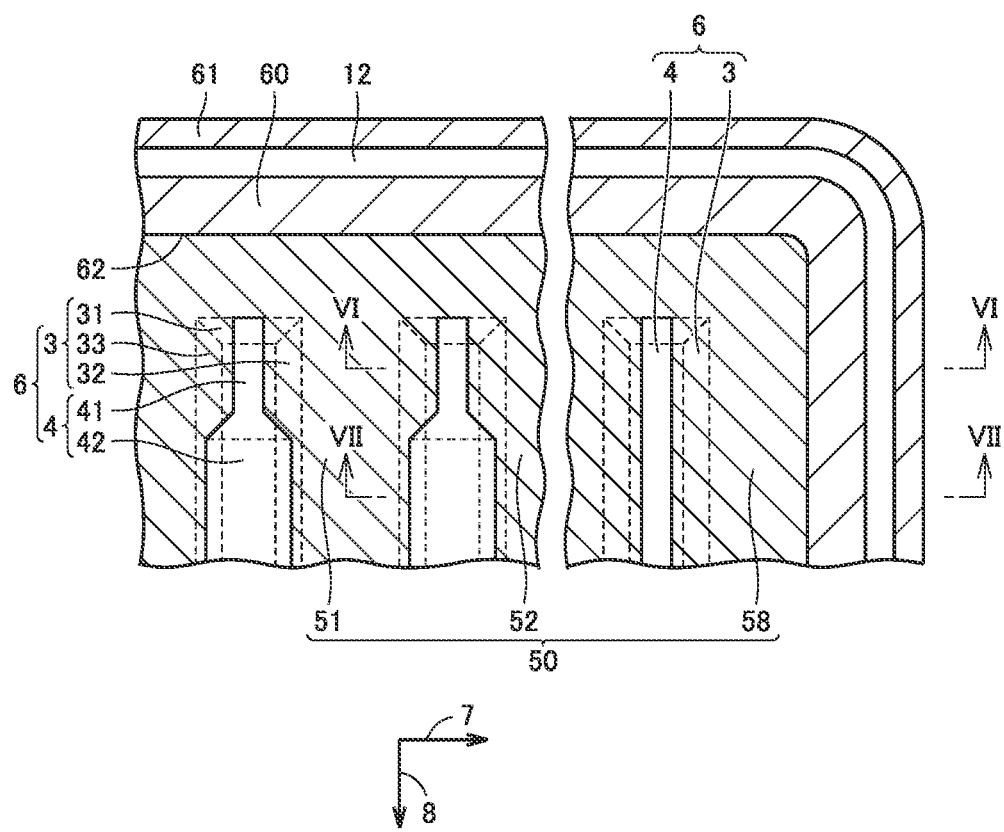
FIG. 5 is an enlarged view of a region V in FIG. 2.
Figure 6:
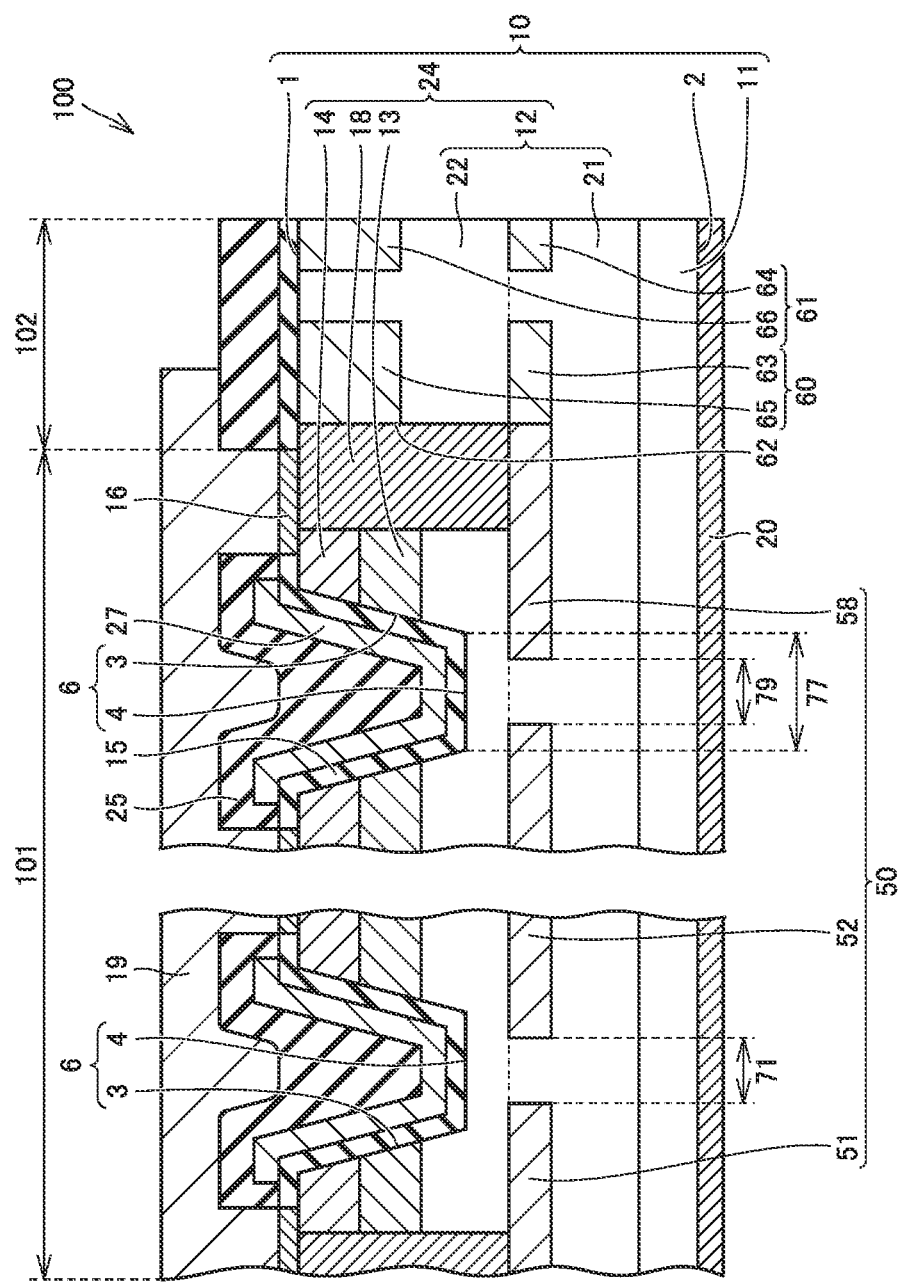
FIG. 6 is a schematic cross sectional view taken along a line VI-VI in FIG. 5.
Figure 7:
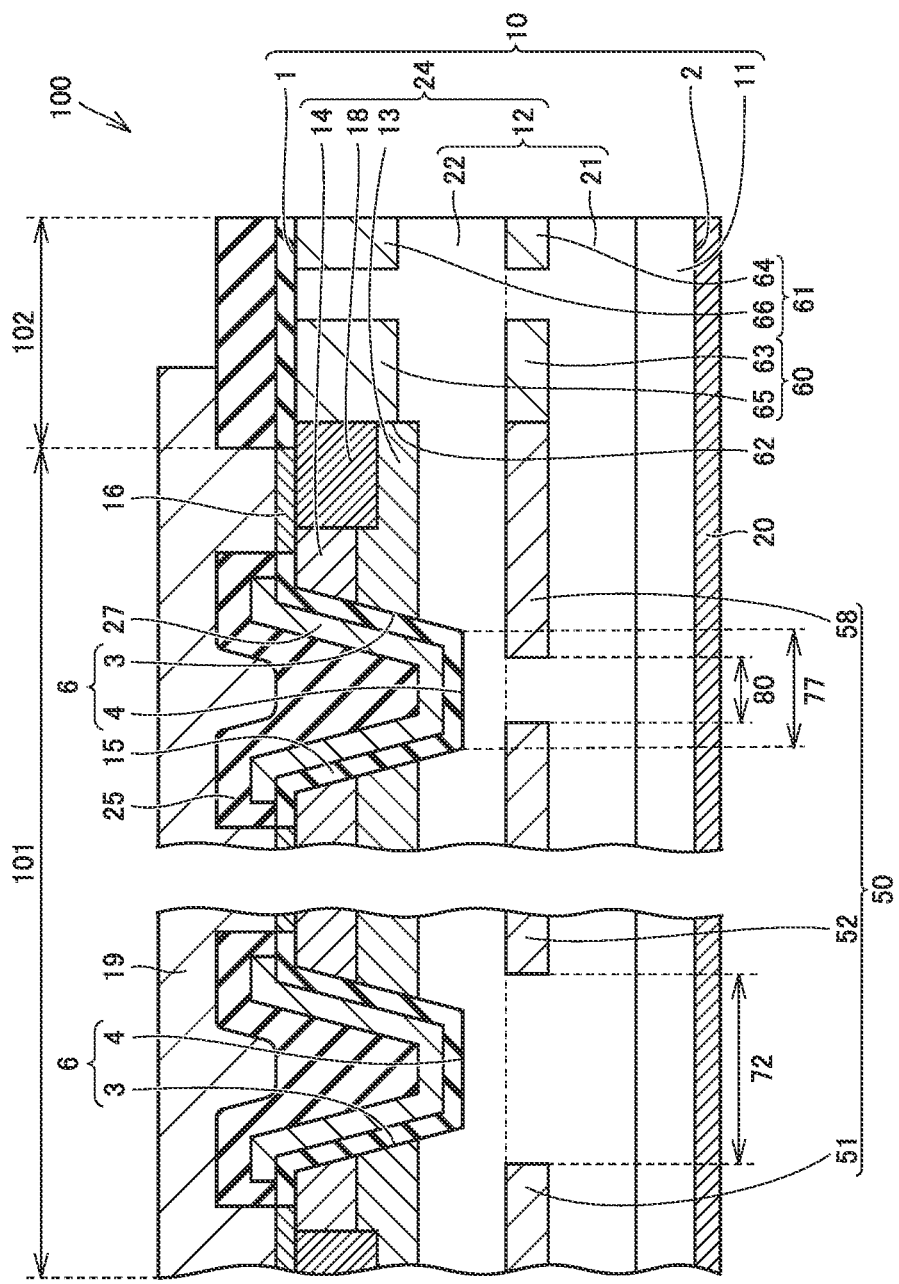
FIG. 7 is a schematic cross sectional view taken along a line VII-VII in FIG. 5.

As shown in FIGS. 5, 6, and 7, in outermost gate trench 6 (in other words, gate trench 6 having a long edge closest to second impurity region 60), a spacing 79 between first region 51 and second region 52 located between first bottom portion 41 and second main surface 2 (see FIG. 6) may be substantially the same as a spacing 80 between first region 51 and second region 52 located between second bottom portion 42 and second main surface 2 (see FIG. 7). Not only in outermost gate trench 6 but also in gate trench 6 in a region within 50 μm to 150 μm from inner end surface 62, spacing 79 between first region 51 and second region 52 located between first bottom portion 41 and second main surface 2 (see FIG. 6) may be substantially the same as spacing 80 between first region 51 and second region 52 located between second bottom portion 42 and second main surface 2 (see FIG. 7). When a cell pitch is 10 μm, for example, around 5 to 15 gate trenches 6 are arranged in the region within 50 μm to 150 μm from inner end surface 62.

Spacing 79 (see FIG. 6) and spacing 80 (see FIG. 7) may be smaller than width 77 of second bottom portion 42.

As shown in FIGS. 6 and 7, termination region 102 has second impurity region 60, guard ring 61, and drift region 12. Second impurity region 60 has an upper JTE 65 and a lower JTE 63. Guard ring 61 has an upper guard ring portion 66 and a lower guard ring portion 64. Lower JTE 63 is located between upper JTE 65 and second main surface 2. Lower guard ring portion 64 is located between upper guard ring portion 66 the second main surface 2. Lower JTE 63 surrounds first impurity region 50. Lower JTE 63 may be in contact with first impurity region 50. Lower guard ring portion 64 surrounds lower JTE 63. Second drift region portion 22 is located between upper JTE 65 and upper guard ring portion 66. First drift region portion 21 is located between lower JTE 63 and lower guard ring portion 64.

Figure 8:
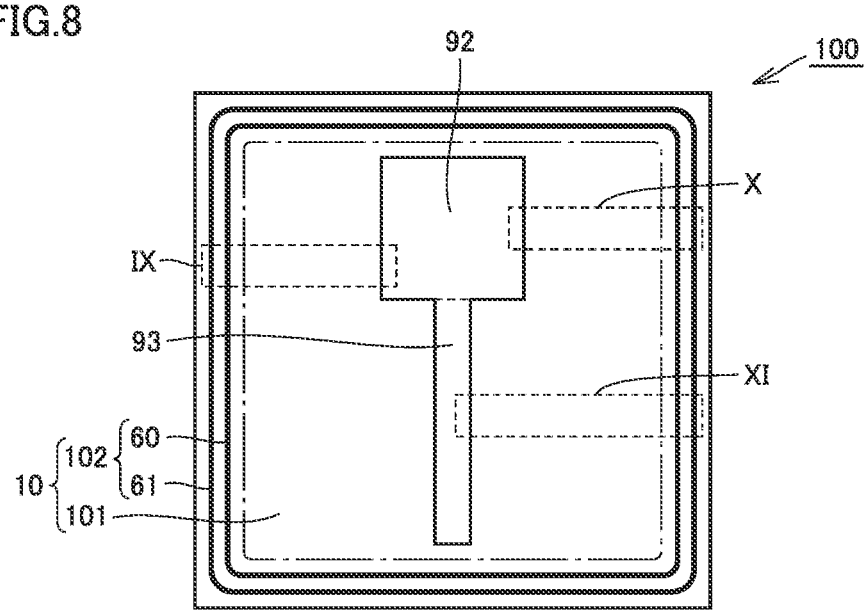
FIG. 8 is a schematic plan view showing a configuration of a variation of the silicon carbide semiconductor device in accordance with the first embodiment.

As shown in FIG. 8, silicon carbide semiconductor device 100 may further have gate pad 92 located on active region 101, and gate runner 93 electrically connected with gate pad 92. Gate pad 92 has a square shape, for example, when viewed in plan view. Gate runner 93 linearly extends from one edge of gate pad 92, for example. Gate runner 93 has a rectangular shape, for example, when viewed in plan view.

Figure 9:
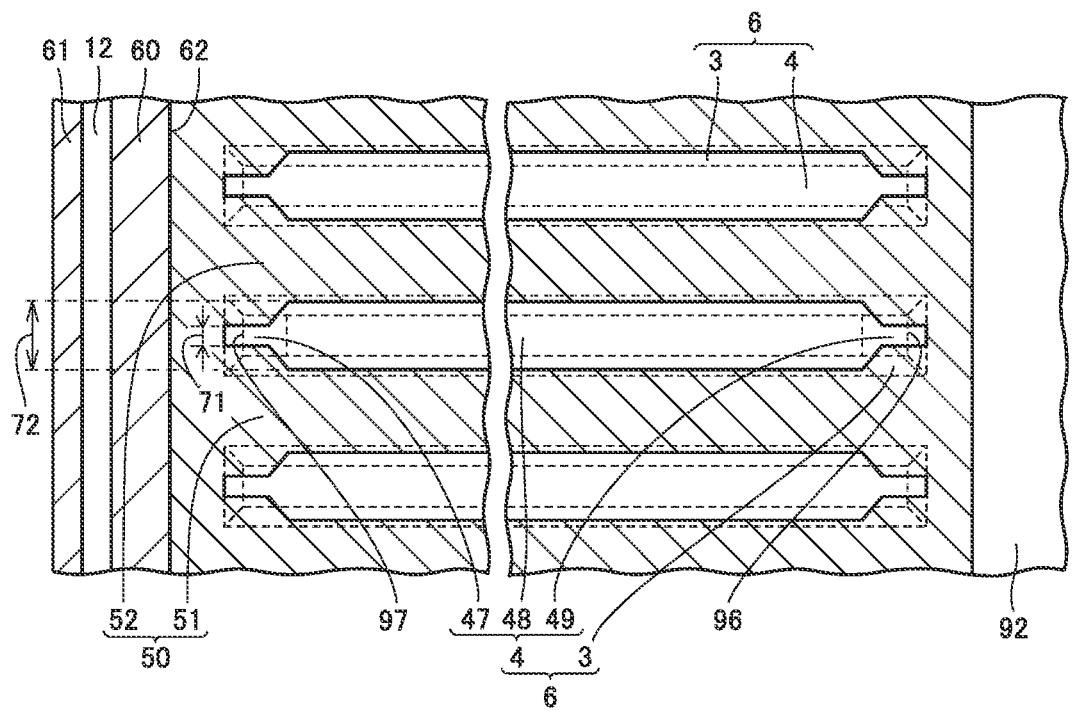
FIG. 9 is an enlarged view of a region IX in FIG. 8.

As shown in FIG. 9, at least one gate trench 6 may include a plurality of gate trenches 6. The plurality of gate trenches 6 are arranged to be spaced from one another along a short direction of the gate trenches. Each of the plurality of gate trenches 6 has bottom surface 4 having a rectangular shape. Bottom surface 4 has first short edge 97, second short edge 96, seventh bottom portion 47, eighth bottom portion 48, and ninth bottom portion 49. Second short edge 96 is located on a side opposite to first short edge 97. First short edge 97 is located on the second impurity region 60 side. Second short edge 96 is located on the gate pad 92 side. Each gate trench 6 extends from the second impurity region 60 side to the gate pad 92 side. Seventh bottom portion 47 is continuous to first short edge 97. Eighth bottom portion 48 is continuous to seventh bottom portion 47. Ninth bottom portion 49 is continuous to both eighth bottom portion 48 and second short edge 96. In a direction parallel to first short edge 97, spacing 71 between first region 51 and second region 52 located between seventh bottom portion 47 and second main surface 2, and spacing 71 between first region 51 and second region 52 located between ninth bottom portion 49 and second main surface 2 may be smaller than spacing 72 between first region 51 and second region 52 located between eighth bottom portion 48 and second main surface 2.

Figure 10:
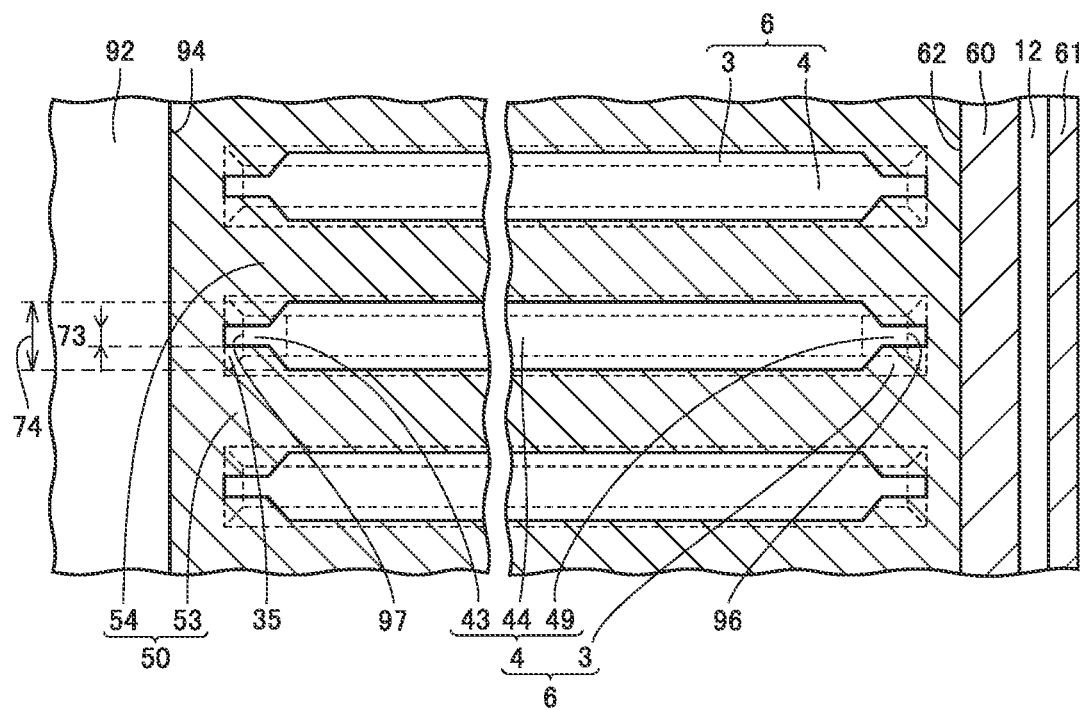
FIG. 10 is an enlarged view of a region X in FIG. 8.

As shown in FIG. 10, side surface 3 of at least one gate trench 6 may have second outer end surface 35 facing first side end surface 94 of gate pad 92. Bottom surface 4 of at least one gate trench 6 has third bottom portion 43, fourth bottom portion 44, and ninth bottom portion 49. Third bottom portion 43 is continuous to second outer end surface 35. Fourth bottom portion 44 is continuous to third bottom portion 43, and is located on a side opposite to first side end surface 94 with respect to third bottom portion 43. Ninth bottom portion 49 is continuous to fourth bottom portion 44, and is located on a side opposite to third bottom portion 43 with respect to fourth bottom portion 44. First short edge 97 is located on the gate pad 92 side. Second short edge 96 is located on the second impurity region 60 side. Gate trench 6 extends from the gate pad 92 side to the second impurity region 60 side.

First impurity region 50 may have third region 53 and fourth region 54 located between at least one gate trench 6 and second main surface 2, and spaced from each other with drift region 12 being sandwiched therebetween. In a direction parallel to second outer end surface 35, a spacing 73 between third region 53 and fourth region 54 located between third bottom portion 43 and second main surface 2 (see FIG. 10) may be smaller than a spacing 74 between third region 53 and fourth region 54 located between fourth bottom portion 44 and second main surface 2 (see FIG. 10). Similarly, in the direction parallel to second outer end surface 35, spacing 73 between third region 53 and fourth region 54 located between ninth bottom portion 49 and second main surface 2 may be smaller than spacing 74 between third region 53 and fourth region 54 located between fourth bottom portion 44 and second main surface 2 (see FIG. 10).

Figure 11:
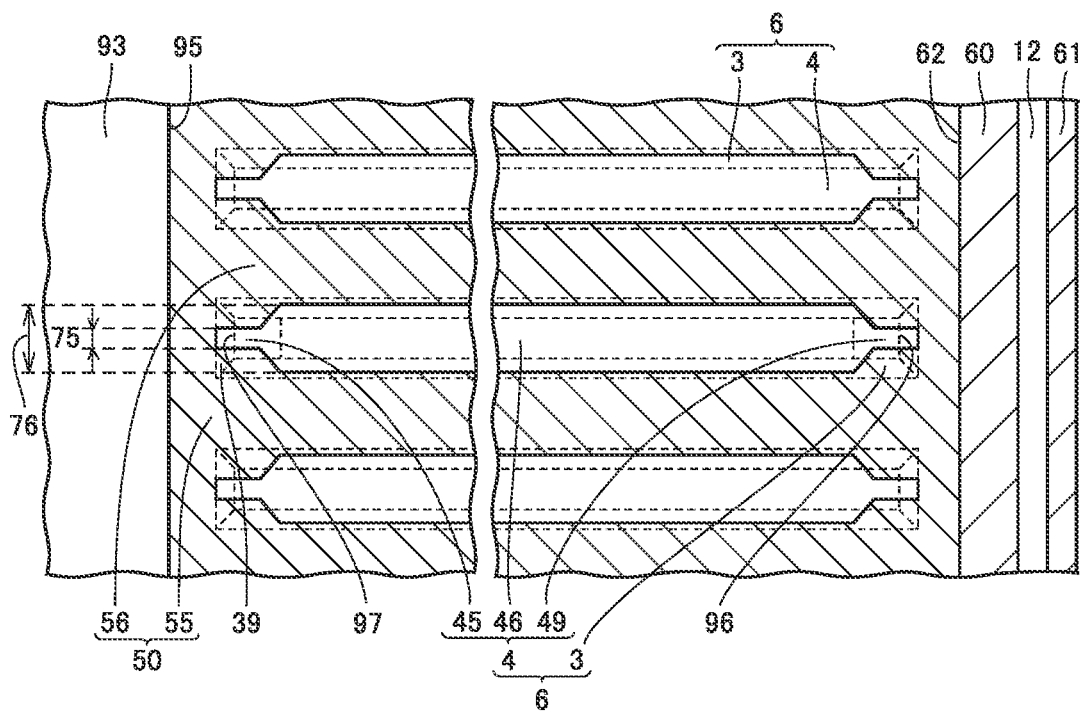
FIG. 11 is an enlarged view of a region XI in FIG. 8.

As shown in FIG. 11, side surface 3 of at least one gate trench 6 may have third outer end surface 39 facing second side end surface 95 of gate runner 93. Bottom surface 4 has fifth bottom portion 45, sixth bottom portion 46, and ninth bottom portion 49. Fifth bottom portion 45 is continuous to third outer end surface 39. Sixth bottom portion 46 is continuous to fifth bottom portion 45, and is located on a side opposite to second side end surface 95 with respect to fifth bottom portion 45. Ninth bottom portion 49 is continuous to sixth bottom portion 46, and is located on a side opposite to fifth bottom portion 45 with respect to sixth bottom portion 46. First short edge 97 is located on the gate runner 93 side. Second short edge 96 is located on the second impurity region 60 side. Gate trench 6 extends from the gate runner 93 side to the second impurity region 60 side.

First impurity region 50 may have fifth region 55 and sixth region 56 located between at least one gate trench 6 and second main surface 2, and spaced from each other with drift region 12 being sandwiched therebetween. In a direction parallel to third outer end surface 39, a spacing 75 between fifth region 55 and sixth region 56 located between fifth bottom portion 45 and second main surface 2 (FIG. 11) may be smaller than a spacing 76 between fifth region 55 and sixth region 56 located between sixth bottom portion 46 and second main surface 2 (FIG. 11). Similarly, in the direction parallel to third outer end surface 39, spacing 75 between fifth region 55 and sixth region 56 located between ninth bottom portion 49 and second main surface 2 may be smaller than spacing 76 between fifth region 55 and sixth region 56 located between sixth bottom portion 46 and second main surface 2 (FIG. 11).

Next, a method for manufacturing MOSFET 100 in accordance with the first embodiment will be described.

Figure 12:
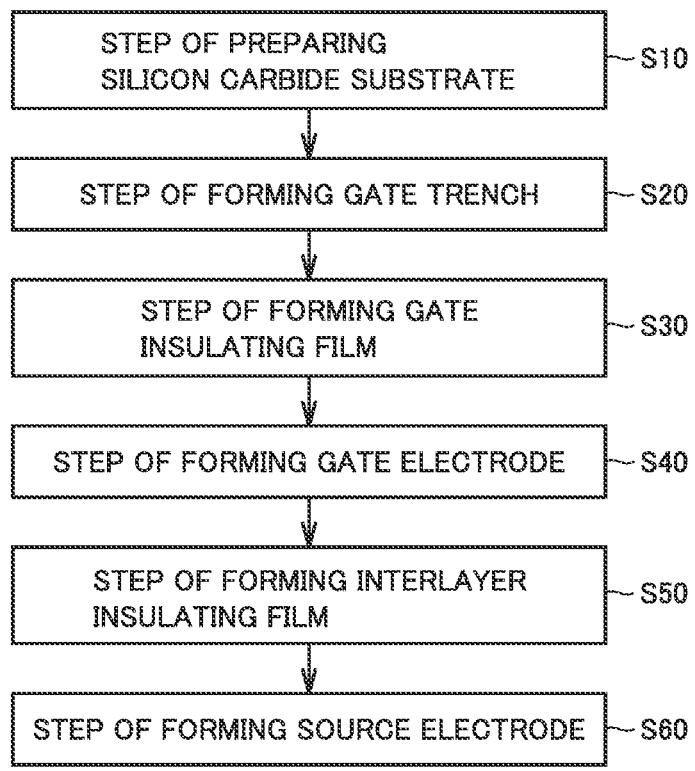
FIG. 12 is a flowchart schematically showing a method for manufacturing the silicon carbide semiconductor device in accordance with the first embodiment.
Figure 13:
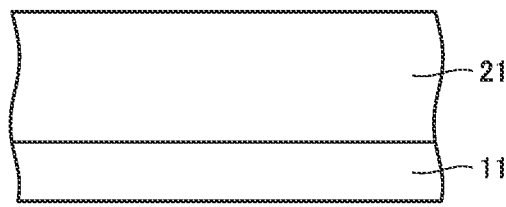
FIG. 13 is a schematic cross sectional view showing a first step of the method for manufacturing the silicon carbide semiconductor device in accordance with the first embodiment.

First, a step of preparing a silicon carbide substrate (S10: FIG. 12) is performed. Silicon carbide single crystal substrate 11 is prepared using a sublimation method, for example. The maximum diameter of the silicon carbide single crystal substrate is more than or equal to 100 mm, for example, and preferably more than or equal to 150 mm. First drift region portion 21 is formed on silicon carbide single crystal substrate 11 by epitaxial growth (see FIG. 13), using a CVD (Chemical Vapor Deposition) method in which: a mixed gas of silane ($SiH_4$) and propane ($C_3H_8$) is used as a source material gas, for example; hydrogen gas ($H_2$) is used as a carrier gas, for example; and ammonia ($NH_3$) is used as a dopant gas. The thickness of first drift region portion 21 is 9 μm, for example. The concentration of nitrogen atoms contained in first drift region portion 21 is about $7\times10^{15}$ $cm^{-3}$, for example.

Figure 14:
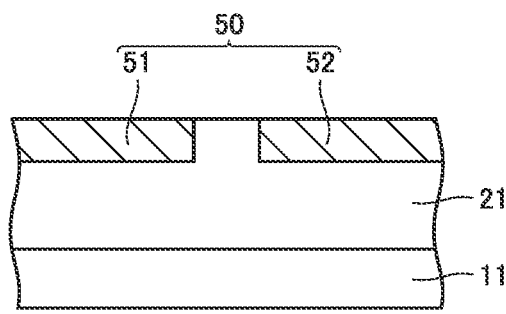
FIG. 14 is a schematic cross sectional view showing a second step of the method for manufacturing the silicon carbide semiconductor device in accordance with the first embodiment.

Then, a mask layer (not shown) is formed on a surface of first drift region portion 21. The mask layer has an opening above a region in which first impurity region 50 is to be formed. Using the mask layer, ions of a p type impurity such as aluminum are implanted into the surface of first drift region portion 21. Thereby, first impurity region 50 exposed at the surface of first drift region portion 21 is formed (see FIG. 14). First impurity region 50 has first region 51 and second region 52 spaced from each other with first drift region portion 21 being sandwiched therebetween. First impurity region 50 is formed such that spacing 71 between first region 51 and second region 52 located between first bottom portion 41 and second main surface 2 is smaller than spacing 72 between first region 51 and second region 52 located between second bottom portion 42 and second main surface 2 (see FIG. 3). Then, the mask layer is removed from the surface of first drift region portion 21.

Then, second drift region portion 22 is formed on first drift region portion 21 and first impurity region 50 by epitaxial growth, using the CVD method in which: a mixed gas of silane and propane is used as a source material gas, for example; hydrogen gas is used as a carrier gas, for example; and ammonia is used as a dopant gas. The thickness of second drift region portion 22 is 3 µm, for example. The concentration of nitrogen atoms contained in second drift region portion 22 is about $3\times10^{16}$ cm$^{-3}$, for example.

Figure 15:
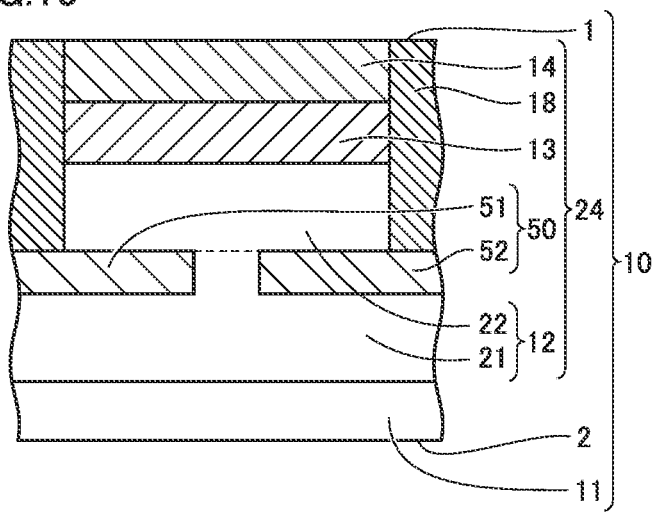
FIG. 15 is a schematic cross sectional view showing a third step of the method for manufacturing the silicon carbide semiconductor device in accordance with the first embodiment.

Then, an ion implantation step is performed. Ions of a p type impurity such as aluminum are implanted into a surface of second drift region portion 22. Thereby, body region 13 in contact with second drift region portion 22 is formed. The thickness of body region 13 is 0.9 µm, for example. Then, ions of an n type impurity such as phosphorus are implanted into body region 13. Thereby, source region 14 having the n type conductivity type is formed. The thickness of source region 14 is 0.4 µm, for example. Source region 14 constitutes first main surface 1. The concentration of the n type impurity contained in source region 14 is higher than the concentration of the p type impurity contained in body region 13. Then, ions of a p type impurity such as aluminum are implanted into source region 14 to form contact region 18. Contact region 18 is formed to penetrate through source region 14 and body region 13, and to be in contact with first impurity region 50 (see FIG. 15). When second drift region 22 is thick, performing ion implantation only once may not be enough to allow contact region 18 to reach first impurity region 50. In this case, contact region 18 can be brought into contact with first impurity region 50 by forming second drift region 22 in two or more separate stages and implanting the p type impurity for each stage. The concentration of the p type impurity contained in contact region 18 may be higher than the concentration of the n type impurity contained in source region 14.

Then, activation annealing is performed to activate the ions of the impurities implanted into silicon carbide substrate 10. The temperature for the activation annealing is preferably more than or equal to 1500° C. and less than or equal to 1900° C., and is about 1700° C., for example. The time for the activation annealing is about 30 minutes, for example. The atmosphere for the activation annealing is preferably an inert gas atmosphere, and is an Ar atmosphere, for example.

Then, a step of forming a gate trench (S20: FIG. 12) is performed. For example, a mask 17 having an opening above a position in which gate trench 6 (FIG. 1) is to be formed is formed on first main surface 1 constituted of source region 14 and contact region 18. Using mask 17, etching is performed to remove source region 14, body region 13, and a portion of second drift region portion 22. As an etching method, for example, reactive ion etching, in particular, inductively coupled plasma reactive ion etching can be used. Specifically, for example, inductively coupled plasma reactive ion etching using $SF_6$ or a mixed gas of $SF_6$ and $O_2$ as a reactive gas can be used. By the etching, a recess is formed in the region in which gate trench 6 is to be formed. The recess has a side portion substantially perpendicular to first main surface 1, and a bottom portion provided to be continuous to the side portion and substantially parallel to first main surface 1.

Then, thermal etching is performed in the recess. The thermal etching can be performed by heating in an atmosphere containing a reactive gas having at least one or more types of halogen atoms, for example, in a state where mask 17 is formed on first main surface 1. The at least one or more types of halogen atoms include at least either of chlorine (Cl) atoms and fluorine (F) atoms. The atmosphere contains $Cl_2$, $BCl_3$, $SF_6$, or $CF_4$, for example. The thermal etching is performed, for example, using a mixed gas of chlorine gas and oxygen gas as a reactive gas, at a heat treatment temperature of more than or equal to 700° C. and less than or equal to 1000° C., for example. It should be noted that the reactive gas may contain a carrier gas, in addition to the chlorine gas and the oxygen gas described above. As the carrier gas, for example, nitrogen gas, argon gas, helium gas, or the like can be used.

Figure 16:
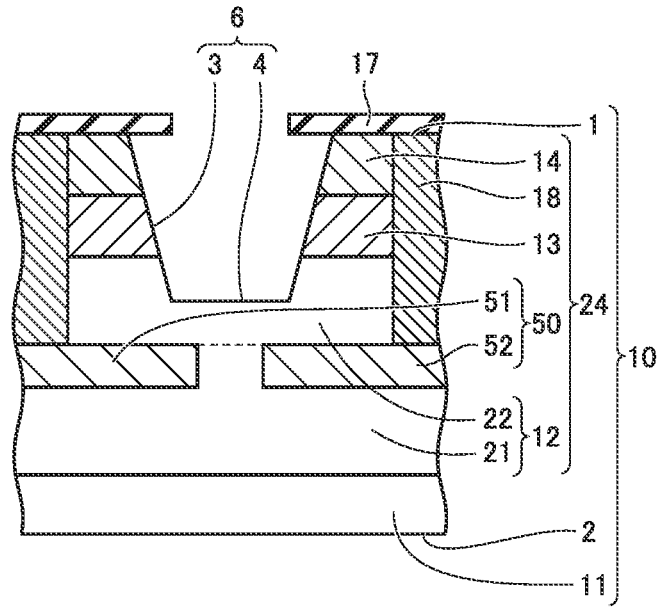
FIG. 16 is a schematic cross sectional view showing a fourth step of the method for manufacturing the silicon carbide semiconductor device in accordance with the first embodiment.

By the thermal etching described above, gate trench 6 is formed in first main surface 1 of silicon carbide substrate 10 (see FIG. 16). Gate trench 6 is defined by side surface 3 and bottom surface 4. Side surface 3 is constituted of source region 14, body region 13, and second drift region portion 22. Bottom surface 4 is constituted of second drift region portion 22. An angle between side surface 3 and a plane along bottom surface 4 is 54.7°, for example. Then, mask 17 is removed from first main surface 1.

Figure 17:
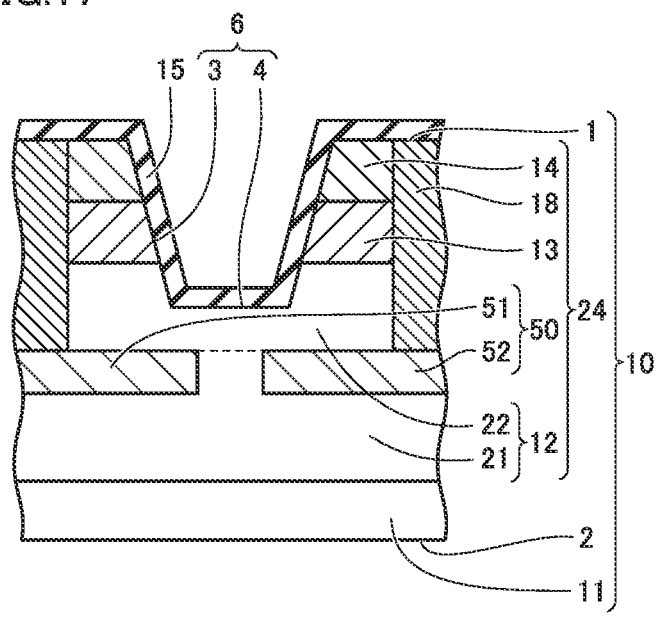
FIG. 17 is a schematic cross sectional view showing a fifth step of the method for manufacturing the silicon carbide semiconductor device in accordance with the First embodiment.

Then, a step of forming a gate insulating film (S30: FIG. 12) is performed. For example, silicon carbide substrate 10 is heated at a temperature of more than or equal to 1300° C. and less than or equal to 1400° C., for example, in an atmosphere containing oxygen. Thereby, there is formed gate insulating film 15 which is in contact with second drift region portion 22 at bottom surface 4, is in contact with second drift region portion 22, body region 13, and source region 14 at side surface 3, and is in contact with source region 14 at first main surface 1 (see FIG. 17).

After forming gate insulating film 15 by thermally oxidizing silicon carbide substrate 10, heat treatment (NO annealing) may be performed on silicon carbide substrate 10 in a nitrogen monoxide (NO) gas atmosphere. In the NO annealing, silicon carbide substrate 10 is held for about 1 hour under a condition of more than or equal to 1100° C. and less than or equal to 1300° C., for example. Thereby, nitrogen atoms are introduced into an interface region between gate insulating film 15 and body region 13. As a result, formation of an interface state in the interface region is suppressed, and thus channel mobility can be improved. It should be noted that a gas other than the NO gas (for example, $N_2O$) may be used as an atmospheric gas, as long as nitrogen atoms can be introduced. After the NO annealing, Ar annealing using argon (Ar) as an atmospheric gas may be further performed. The heating temperature for the Ar annealing is more than or equal to the heating temperature for the above NO annealing, for example. The time for the Ar annealing is about 1 hour, for example. This further suppresses formation of an interface state in the interface region between gate insulating film 15 and body region 13.

Then, a step of forming a gate electrode (S40: FIG. 12) is performed. For example, gate electrode 27 in contact with gate insulating film 15 inside gate trench 6 is formed. Gate electrode 27 is arranged inside gate trench 6, and is formed on gate insulating film 15 to face each of side surface 3 and bottom surface 4 of gate trench 6. Gate electrode 27 is formed by a LPCVD (Low Pressure Chemical Vapor Deposition) method, for example.

Figure 18:
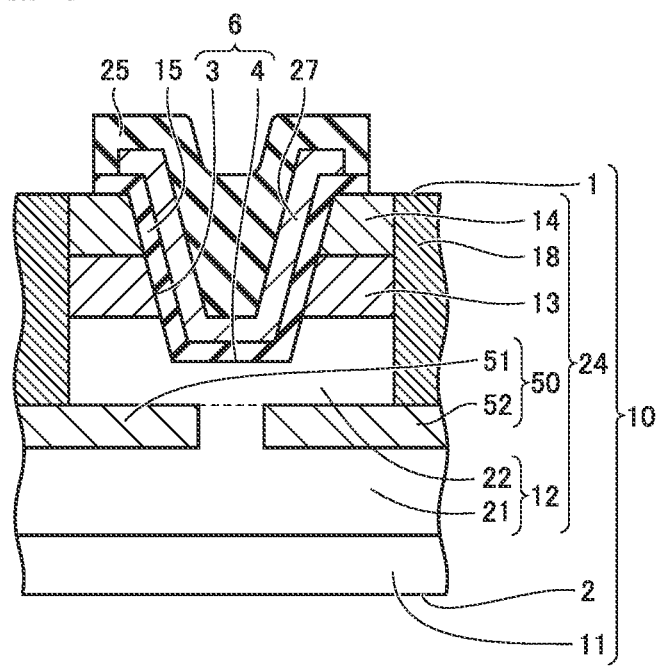
FIG. 18 is a schematic cross sectional view showing a sixth step of the method for manufacturing the silicon carbide semiconductor device in accordance with the first embodiment.

Then, a step of forming an interlayer insulating film (S50: FIG. 12) is formed. For example, interlayer insulating film 25 is formed to cover gate electrode 27, and to be in contact with gate insulating film 15. Interlayer insulating film 25 is preferably formed by a deposition method, and is more preferably formed by a chemical vapor deposition method. Interlayer insulating film 25 is made of a material containing silicon dioxide, for example. Then, portions of interlayer insulating film 25 and gate insulating film 15 are etched such that an opening is formed above source region 14 and contact region 18. Thereby, contact region 18 and source region 14 are exposed from gate insulating film 15 (see FIG. 18).

Then, a step of forming a source electrode (S60: FIG. 12) is performed. Then, source electrode 16 in contact with source region 14 and contact region 18 at first main surface 1 is formed. Source electrode 16 is formed by a sputtering method, for example. Source electrode 16 is made of a material containing Ti, Al, and Si, for example. Then, alloying annealing is performed. Specifically, source electrode 16 in contact with source region 14 and contact region 18 is held at a temperature of more than or equal to 900° C. and less than or equal to 1100° C. for about 5 minutes, for example. Thereby, at least a portion of source electrode 16 reacts with silicon contained in silicon carbide substrate 10 and is silicided. Thereby, source electrode 16 in ohmic junction with source region 14 is formed. Preferably, source electrode 16 is in ohmic junction with contact region 18.

Then, source wire 19 electrically connected with source electrode 16 is formed. Source wire 19 is formed on source electrode 16 and interlayer insulating film 25. Then, silicon carbide substrate 10 is subjected to back grinding at second main surface 2. Thereby, silicon carbide substrate 10 is thinned. Then, drain electrode 20 is formed in contact with second main surface 2. In this manner, MOSFET 100 in accordance with the first embodiment (FIG. 1) is manufactured.

Next, the function and effect of the MOSFET in accordance with the first embodiment will be described.

According to MOSFET 100 in accordance with the first embodiment, the spacing between first region 51 and second region 52 located between first bottom portion 41 located on the outer peripheral side and second main surface 2 is smaller than the spacing between first region 51 and second region 52 located between second bottom portion 42 located on the inner peripheral side and second main surface 2. By decreasing the spacing between first region 51 and second region 52 on the outer peripheral side having a relatively high electric field intensity, electric field concentration in gate trench 6 can be relieved. On the other hand, by increasing the spacing between first region 51 and second region 52 on the inner peripheral side having a relatively low electric field intensity, a wide current path can be secured and an ON resistance of MOSFET 100 can be reduced.

Further, according to MOSFET 100 in accordance with the first embodiment, the spacing between third region 53 and fourth region 54 located between third bottom portion 43 proximal to gate pad 92 and second main surface 2 is smaller than the spacing between third region 53 and fourth region 54 located between fourth bottom portion 44 distal to gate pad 92 and second main surface 2. By decreasing the spacing between third region 53 and fourth region 54 at a position proximal to gate pad 92 having a relatively high electric field intensity, electric field concentration in gate trench 6 can be relieved. On the other hand, by increasing the spacing between third region 53 and fourth region 54 at a position distal to gate pad 92 having a relatively low electric field intensity, a wide current path can be secured and the ON resistance of MOSFET 100 can be reduced.

Furthermore, according to MOSFET 100 in accordance with the first embodiment, the spacing between fifth region 55 and sixth region 56 located between fifth bottom portion 45 proximal to gate runner 93 and second main surface 2 is smaller than the spacing between fifth region 55 and sixth region 56 located between sixth bottom portion 46 distal to gate runner 93 and second main surface 2. By decreasing the spacing between fifth region 55 and sixth region 56 at a position proximal to gate runner 93 having a relatively high electric field intensity, electric field concentration in gate trench 6 can be relieved. On the other hand, by increasing the spacing between fifth region 55 and sixth region 56 at a position distal to gate runner 93 having a relatively low electric field intensity, a wide current path can be secured and the ON resistance of MOSFET 100 can be reduced.

Second Embodiment

Next, a configuration of a silicon carbide semiconductor device in accordance with a second embodiment of the present disclosure will be described. The configuration of MOSFET 100 in accordance with the second embodiment is different from the configuration of the MOSFET in accordance with the first embodiment in terms of a component described below, and other components are substantially the same as those in the configuration of the MOSFET in accordance with the first embodiment.

Figure 19:
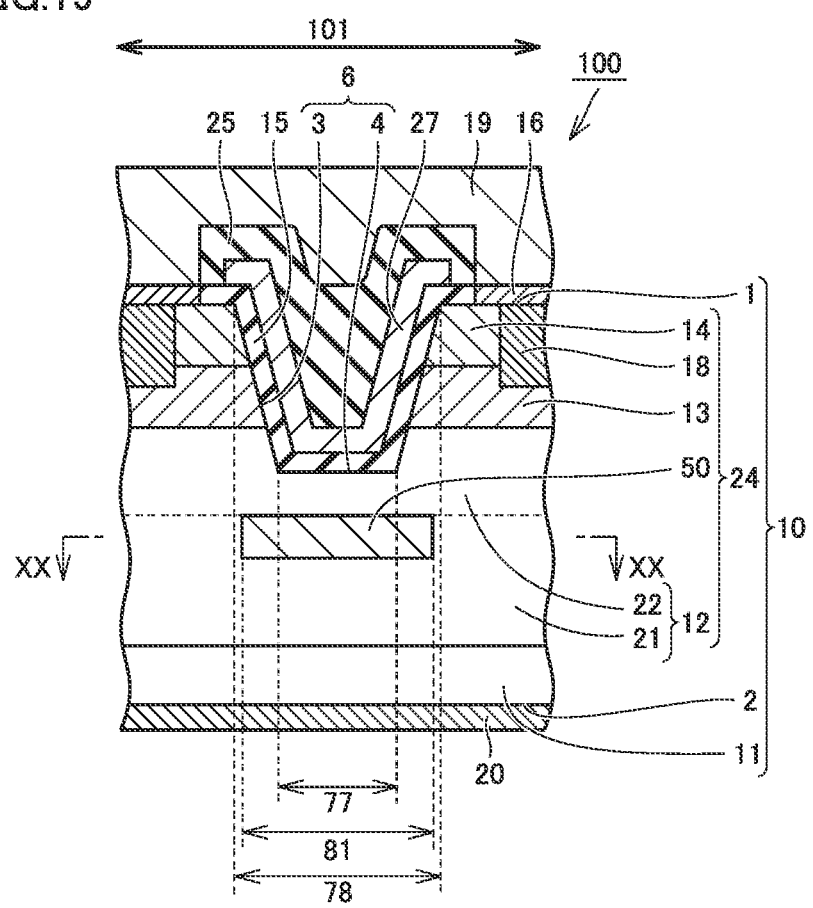
FIG. 19 is a schematic cross sectional view showing a configuration of a silicon carbide semiconductor device in accordance with a second embodiment, and taken along a line XIX-XIX in FIG. 20.

As shown in FIG. 19, first impurity region 50 may be located between bottom surface 4 of gate trench 6 and second main surface 2 to face bottom surface 4. First impurity region 50 may be located between side surface 3 of gate trench 6 and second main surface 2 to face side surface 3.

Figure 20:
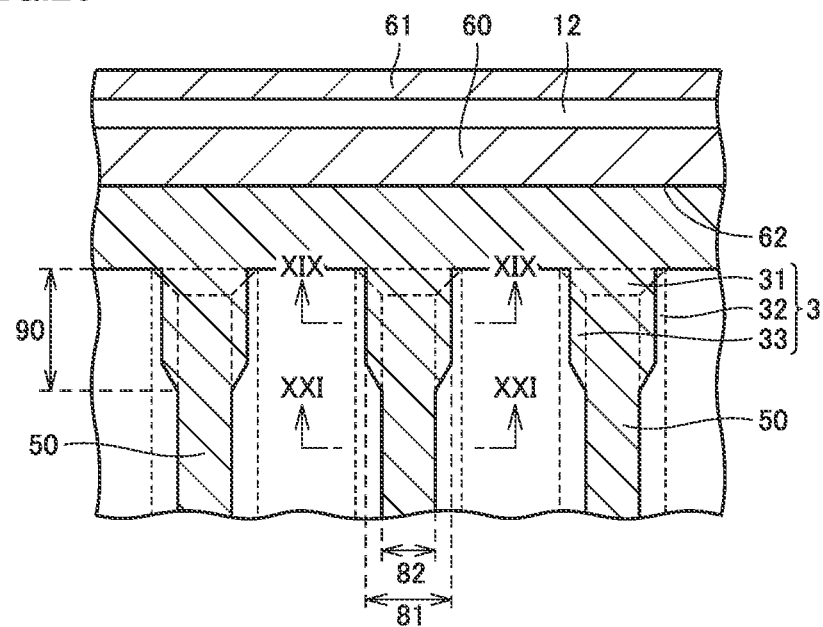
FIG. 20 is a schematic plan view showing the configuration of the silicon carbide semiconductor device in accordance with the second embodiment.

As shown in FIG. 20, side surface 3 of gate trench 6 has first outer end surface 31 facing inner end surface 62 of second impurity region 60. Bottom surface 4 has first bottom portion 41 continuous to first outer end surface 31, and second bottom portion 42 continuous to first bottom portion 41 and located on a side opposite to inner end surface 62 with respect to first bottom portion 41. In a direction parallel to first outer end surface 31, a width 81 of first impurity region 50 located between first bottom portion 41 and second main surface 2 (see FIG. 19) is larger than a width 82 of first impurity region 50 located between second bottom portion 42 and second main surface 2 (see FIG. 21).

Figure 21:
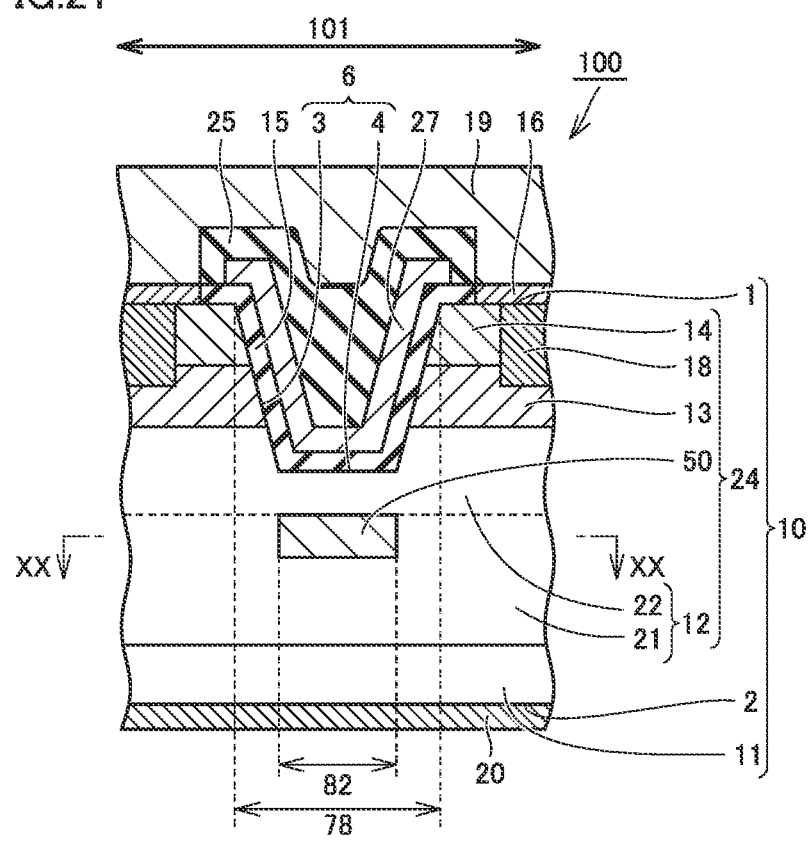
FIG. 21 is a schematic cross sectional view showing the configuration of the silicon carbide semiconductor device in accordance with the second embodiment, and taken along a line XXI-XXI in FIG. 20.

As shown in FIG. 19, width 81 of first impurity region 50 located between first bottom portion 41 and second main surface 2 may be larger than width 77 of bottom surface 4 of gate trench 6, and may be smaller than width 78 of the opening in gate trench 6. As shown in FIG. 21, width 82 of first impurity region 50 located between second bottom portion 42 and second main surface 2 may be substantially the same as width 77 of bottom surface 4 of gate trench 6 (see FIG. 19), or may be smaller than width 77 of bottom surface 4 of gate trench 6.

As shown in FIG. 20, a width of first bottom portion 41 in a direction perpendicular to inner end surface 62 is more than or equal to 50 µm, for example. The width of first bottom portion 41 in the direction perpendicular to inner end surface 62 may be more than or equal to 100 µm, or may be more than or equal to 150 µm.

As shown in FIGS. 22 and 23, first impurity region 50 may be in contact with bottom surface 4. Bottom surface 4 of gate trench 6 may be located at the top surface of first impurity region 50, or may be located inside first impurity region 50. Also in this case, in the direction parallel to first outer end surface 31, width 81 of first impurity region 50 located between first bottom portion 41 and second main surface 2 (see FIG. 22) is larger than width 82 of first impurity region 50 located between second bottom portion 42 and second main surface 2 (see FIG. 23).

As shown in FIG. 24, at least one gate trench 6 may include a plurality of gate trenches 6. The plurality of gate trenches 6 are arranged to be spaced from one another along the short direction of the gate trenches. Each of the plurality of gate trenches 6 has bottom surface 4 having a rectangular shape. Bottom surface 4 has first short edge 97, second short edge 96, seventh bottom portion 47, eighth bottom portion 48, and ninth bottom portion 49. Second short edge 96 is located on a side opposite to first short edge 97. First short edge 97 is located on the second impurity region 60 side. Second short edge 96 is located on the gate pad 92 side. Each gate trench 6 extends from the second impurity region 60 side to the gate pad 92 side. Seventh bottom portion 47 is continuous to first short edge 97. Eighth bottom portion 48 is continuous to seventh bottom portion 47. Ninth bottom portion 49 is continuous to both eighth bottom portion 48 and second short edge 96. In a direction parallel to first short edge 97, a width of first impurity region 50 located between seventh bottom portion 47 and second main surface 2, and a width of first impurity region 50 located between ninth bottom portion 49 and second main surface 2 may be larger than a width of first impurity region 50 located between eighth bottom portion 48 and second main surface 2.

Figure 25:
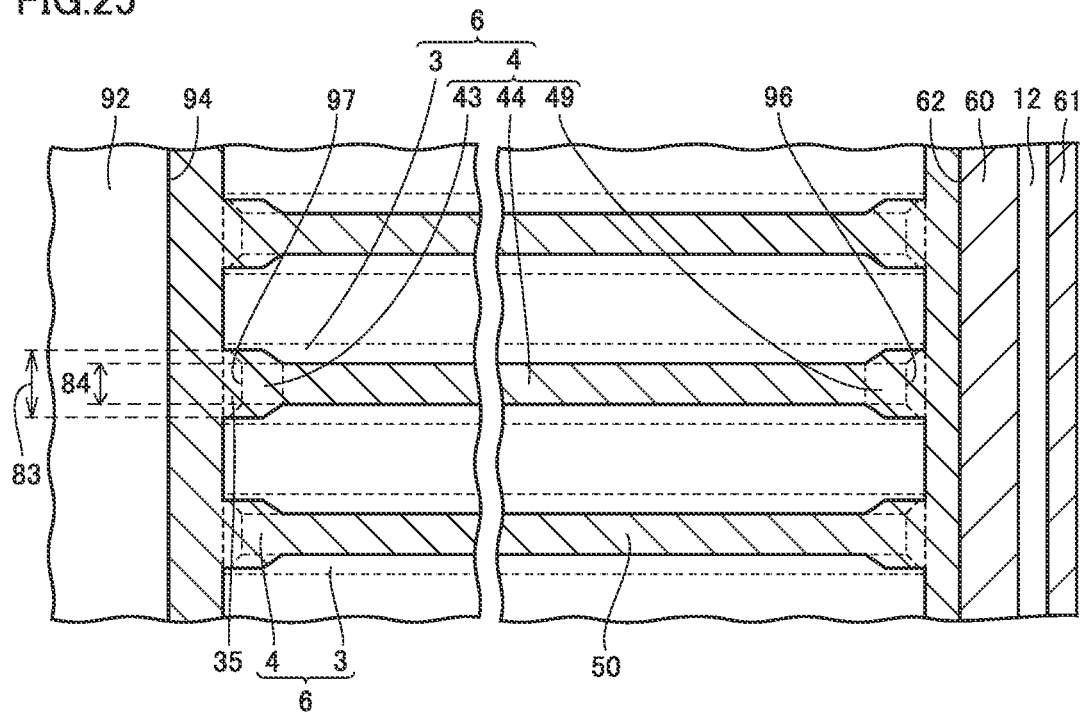
FIG. 25 is a schematic plan view showing the configuration of the silicon carbide semiconductor device in accordance with the second embodiment, and in a region corresponding to region X in FIG. 8.

As shown in FIG. 25, side surface 3 of at least one gate trench 6 may have second outer end surface 35 facing first side end surface 94 of grate pad 92. Bottom surface 4 of at least one gate trench 6 has third bottom portion 43, fourth bottom portion 44, and ninth bottom portion 49. Third bottom portion 43 is continuous to second outer end surface 35. Fourth bottom portion 44 is continuous to third bottom portion 43, and is located on a side opposite to first side end surface 94 with respect to third bottom portion 43. Ninth bottom portion 49 is continuous to fourth bottom portion 44, and is located on a side opposite to third bottom portion 43 with respect to fourth bottom portion 44. First short edge 97 is located on the gate pad 92 side. Second short edge 96 is located on the second impurity region 60 side. Gate trench 6 extends from the gate pad 92 side to the second impurity region 60 side.

First impurity region 50 is provided to face third bottom portion 43, fourth bottom portion 44, and ninth bottom portion 49. In a direction parallel to second outer end surface 35, a width 83 of first impurity region 50 located between third bottom portion 43 and second main surface 2 (see FIG. 25) may be larger than a width 84 of first impurity region 50 located between fourth bottom portion 44 and second main surface 2 (see FIG. 25). Similarly, in the direction parallel to second outer end surface 35, width 83 of first impurity region 50 located between ninth bottom portion 49 and second main surface 2 may be larger than width 84 of first impurity region 50 located between fourth bottom portion 44 and second main surface 2 (see FIG. 25).

Figure 26:
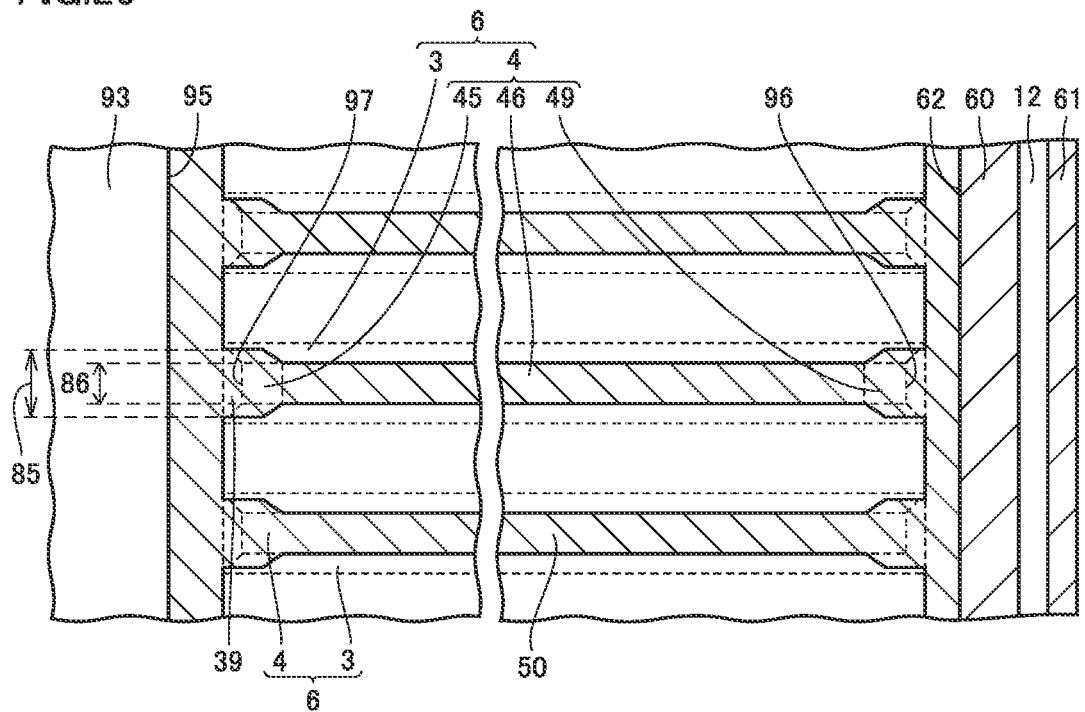
FIG. 26 is a schematic plan view showing the configuration of the silicon carbide semiconductor device in accordance with the second embodiment, and in a region corresponding to region XI in FIG. 8.

As shown in FIG. 26, side surface 3 of at least one gate trench 6 may have third outer end surface 39 facing second side end surface 95 of gate runner 93. Bottom surface 4 has fifth bottom portion 45, sixth bottom portion 46, and ninth bottom portion 49. Fifth bottom portion 45 is continuous to third outer end surface 39. Sixth bottom portion 46 is continuous to fifth bottom portion 45, and is located on a side opposite to second side end surface 95 with respect to fifth bottom portion 45. Ninth bottom portion 49 is continuous to sixth bottom portion 46, and is located on a side opposite to fifth bottom portion 45 with respect to sixth bottom portion 46. First short edge 97 is located on the gate runner 93 side. Second short edge 96 is located on the second impurity region 60 side. Gate trench 6 extends from the gate runner 93 side to the second impurity region 60 side.

First impurity region 50 is provided to face Fifth bottom portion 45, sixth bottom portion 46, and ninth bottom portion 49. In a direction parallel to third outer end surface 39, a width 85 of first impurity region 50 located between fifth bottom portion 45 and second main surface 2 (FIG. 26) may be larger than a width 86 of first impurity region 50 located between sixth bottom portion 46 and second main surface 2 (FIG. 26). Similarly, in the direction parallel to third outer end surface 39, width 86 of first impurity region 50 located between ninth bottom portion 49 and second main surface 2 may be smaller than width 85 of first impurity region 50 located between sixth bottom portion 46 and second main surface 2 (FIG. 26). It should be noted that the MOSFET in accordance with the second embodiment can be manufactured by a manufacturing method identical to that for the MOSFET in accordance with the first embodiment.

Next, the function and effect of the MOSFET in accordance with the second embodiment will be described.

According to MOSFET 100 in accordance with the second embodiment, the width of p type region 50 located between first bottom portion 41 located on the outer peripheral side and second main surface 2 is larger than the width of p type region 50 located between second bottom portion 42 located on the inner peripheral side and second main surface 2. By increasing the width of p type region 50 on the outer peripheral side having a relatively high electric field intensity, electric field concentration in gate trench 6 can be relieved. On the other hand, by decreasing the width of p type region 50 on the inner peripheral side having a relatively low electric field intensity, a wide current path can be secured and an ON resistance of MOSFET 100 can be reduced.

Further, according to MOSFET 100 in accordance with the second embodiment, the width of p type region 50 located between third bottom portion 43 proximal to gate pad 92 and second main surface 2 is larger than the width of p type region 50 located between fourth bottom portion 44 distal to gate pad 92 and second main surface 2. By increasing the width of p type region 50 at a position proximal to gate pad 92 having a relatively high electric field intensity, electric field concentration in gate trench 6 can be relieved. On the other hand, by decreasing the width of p type region 50 at a position distal to gate pad 92 having a relatively low electric field intensity, a wide current path can be secured and the ON resistance of MOSFET 100 can be reduced.

Furthermore, according to MOSFET 100 in accordance with the second embodiment, the width of p type region 50 located between fifth bottom portion 45 proximal to gate runner 93 and second main surface 2 is larger than the width of p type region 50 located between sixth bottom portion 46 distal to gate runner 93 and second main surface 2. By increasing the width of p type region 50 at a position proximal to gate runner 93 having a relatively high electric field intensity, electric field concentration in gate trench 6 can be relieved. On the other hand, by decreasing the width of p type region 50 at a position distal to gate runner 93 having a relatively low electric field intensity, a wide current path can be secured and the ON resistance of MOSFET 100 can be reduced.

Third Embodiment

Next, a configuration of a silicon carbide semiconductor device in accordance with a third embodiment of the present disclosure will be described. The configuration of MOSFET 100 in accordance with the third embodiment substantially has a component obtained by combining the first impurity region of MOSFET 100 in accordance with the first embodiment and the first impurity region of MOSFET 100 in accordance with the second embodiment. For components other than the first impurity region, the configuration of MOSFET 100 in accordance with the third embodiment is substantially the same as the configuration of the MOSFET in accordance with the first embodiment.

Figure 27:
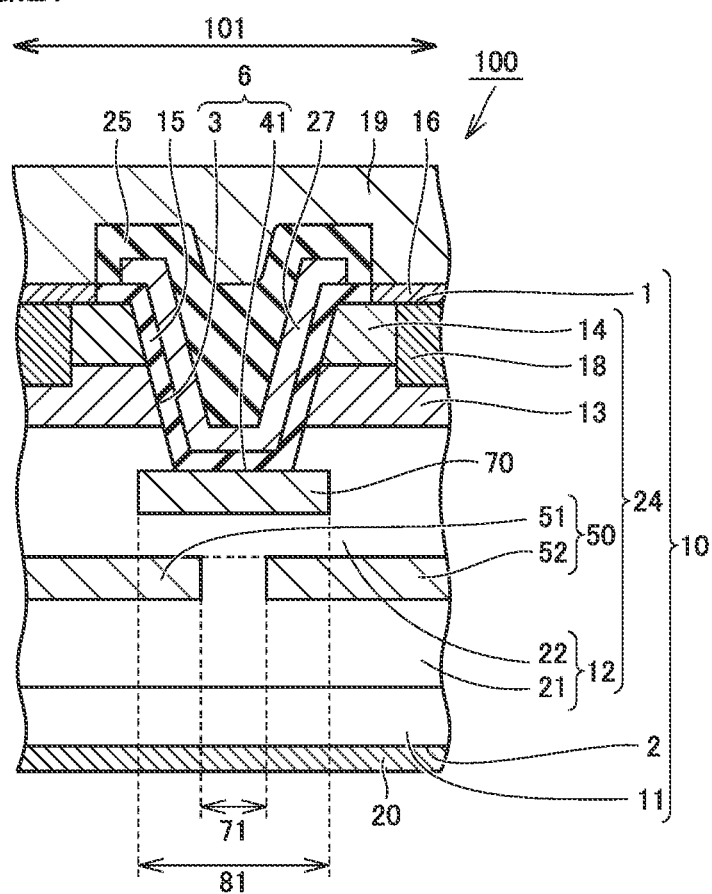
FIG. 27 is a schematic cross sectional view showing a configuration of a silicon carbide semiconductor device in accordance with a third embodiment, and corresponding to a region along line I-I in FIG. 3.
Figure 28:
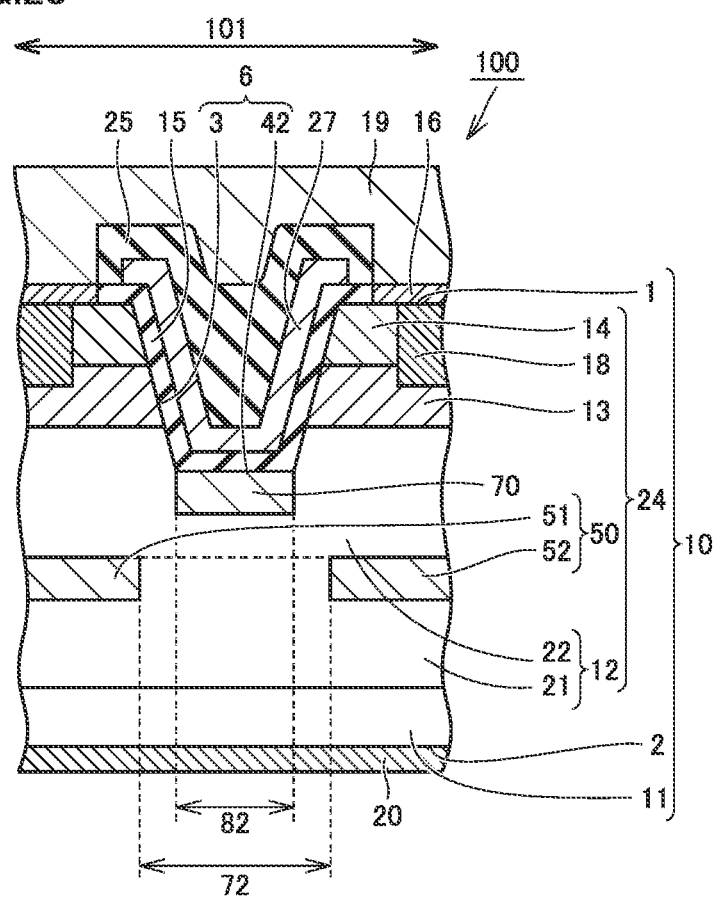
FIG. 28 is a schematic cross sectional view showing the configuration of the silicon carbide semiconductor device in accordance with the third embodiment, and corresponding to a region along line IV-IV in FIG. 3.

As shown in FIGS. 27 and 28, active region 101 has first impurity region 50 and third impurity region 70. First impurity region 50 has first region 51 and second region 52 spaced from each other with drift region 12 being sandwiched therebetween. The configuration of third impurity region 70 in the third embodiment is substantially the same as the configuration of first impurity region 50 in the second embodiment.

As shown in FIGS. 27 and 28, third impurity region 70 is located between bottom surface 4 and second main surface 2 to face bottom surface 4. In the direction perpendicular to first main surface 1, first impurity region 50 is located between third impurity region 70 and second main surface 2. Third impurity region 70 has the second conductivity type. In the direction parallel to first outer end surface 31, width 81 of third impurity region 70 located between first bottom portion 41 and second main surface 2 (see FIG. 27) is larger than width 82 of third impurity region 70 located between second bottom portion 42 and second main surface 2 (see FIG. 28).

As shown in FIG. 27, in the direction perpendicular to first main surface 1, first bottom portion 41, third impurity region 70, and first region 51 may partially overlap. Similarly, in the direction perpendicular to first main surface 1, first bottom portion 41, third impurity region 70, and second region 52 may partially overlap. Width 81 of third impurity region 70 may be larger than spacing 71 between first region 51 and second region 52.

As shown in FIG. 28, in the direction perpendicular to first main surface 1, third impurity region 70 and first region 51 may be spaced from each other in a direction parallel to first main surface 1 so as not to overlap with each other. Similarly, in the direction perpendicular to first main surface 1, first region 51 and second region 52 may be spaced from each other in the direction parallel to first main surface 1 such that third impurity region 70 and second region 52 do not overlap with each other. Width 82 of third impurity region 70 may be smaller than spacing 72 between first region 51 and second region 52. It should be noted that the MOSFET in accordance with the third embodiment can be manufactured by a manufacturing method identical to that for the MOSFET in accordance with the first embodiment.

Next, the function and effect of the MOSFET in accordance with the third embodiment will be described.

According to MOSFET 100 in accordance with the third embodiment, in the direction parallel to first outer end surface 31, the width of third impurity region 70 located between first bottom portion 41 and second main surface 2 is larger than the width of third impurity region 70 located between second bottom portion 42 and second main surface 2. By increasing the width of third impurity region 70 on the outer peripheral side having a relatively high electric field intensity, electric field concentration in gate trench 6 can be further relieved.

Fourth Embodiment

Next, a configuration of a silicon carbide semiconductor device in accordance with a fourth embodiment of the present disclosure will be described. The configuration of MOSFET 100 in accordance with the fourth embodiment is different from the configuration of the MOSFET in accordance with the first embodiment in terms of a component described below, and other components are substantially the same as those in the configuration of the MOSFET in accordance with the first embodiment.

Figure 29:
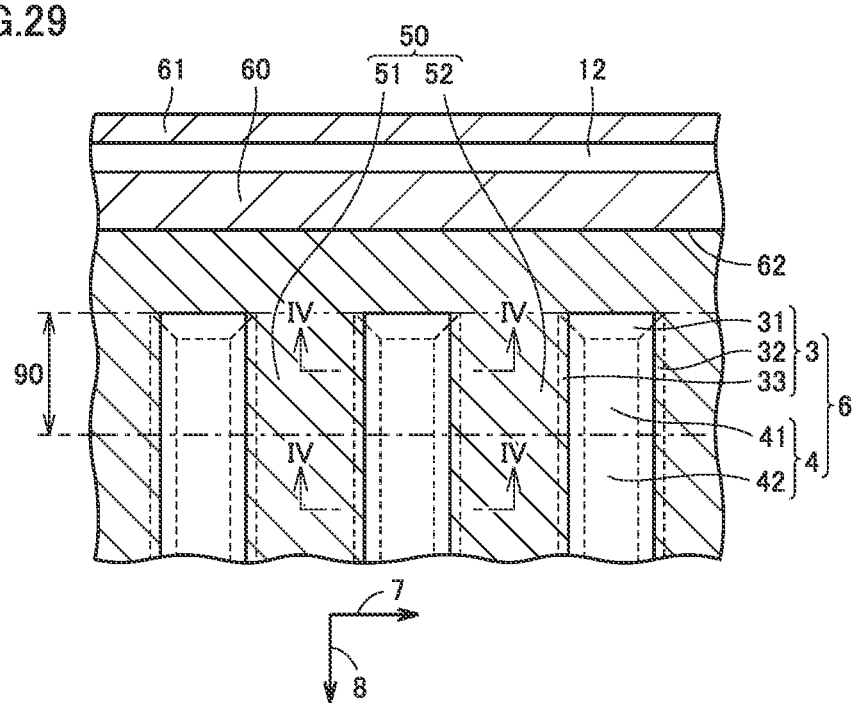
FIG. 29 is a schematic plan view showing a configuration of a silicon carbide semiconductor device in accordance with a fourth embodiment.

As shown in FIG. 29, second impurity region 60 has inner end surface 62 facing the active region. Side surface 3 of gate trench 6 has first outer end surface 31 facing inner end surface 62. Bottom surface 4 has first bottom portion 41 and second bottom portion 42. First bottom portion 41 is continuous to first outer end surface 31. Second bottom portion 42 is continuous to first bottom portion 41, and is located on a side opposite to inner end surface 62 with respect to first bottom portion 41. In direction 7 parallel to first outer end surface 31, a spacing between first region 51 and second region 52 located between first bottom portion 41 and second main surface 2 may be substantially the same as a spacing between first region 51 and second region 52 located between second bottom portion 42 and second main surface 2.

The concentration of the p type impurity in first region 51 and second region 52 located between first bottom portion 41 and second main surface 2 is higher than the concentration of the p type impurity in first region 51 and second region 52 located between second bottom portion 42 and second main surface 2. Desirably, the concentration of the p type impurity in first region 51 and second region 52 located between first bottom portion 41 and second main surface 2 is higher than the concentration of the p type impurity in first region 51 and second region 52 located between second bottom portion 42 and second main surface 2 by more than or equal to 1.5 times and less than or equal to 50 times.

As shown in FIG. 4, the spacing between first region 51 and second region 52 located between second bottom portion 42 and second main surface 2 may be larger than width 77 of second bottom portion 42 and smaller than width 78 of the opening in gate trench 6. Similarly, the spacing between first region 51 and second region 52 located between first bottom portion 41 and second main surface 2 may be larger than width 77 of second bottom portion 42 and smaller than width 78 of the opening in gate trench 6. Width 90 of first bottom portion 41 in direction 8 perpendicular to inner end surface 62 (see FIG. 29) is more than or equal to 50 μm, for example. Width 90 of first bottom portion 41 in the direction perpendicular to inner end surface 62 may be more than or equal to 100 μm, or may be more than or equal to 150 μm. It should be noted that the MOSFET in accordance with the fourth embodiment can be manufactured by a manufacturing method identical to that for the MOSFET in accordance with the first embodiment.

Next, the function and effect of the MOSFET in accordance with the fourth embodiment will be described.

According to MOSFET 100 in accordance with the fourth embodiment, the concentration of the p type impurity in first region 51 and second region 52 located between first bottom portion 41 located on the outer peripheral side and second main surface 2 is higher than the concentration of the p type impurity in first region 51 and second region 52 located between second bottom portion 42 located on the inner peripheral side and second main surface 2. By increasing the concentration of the p type impurity in first region 51 and second region 52 on the outer peripheral side having a relatively high electric field intensity, electric field concentration in gate trench 6 can be relieved.

Fifth Embodiment

Next, a configuration of a silicon carbide semiconductor device in accordance with a fifth embodiment of the present disclosure will be described. The configuration of MOSFET 100 in accordance with the fifth embodiment is different from the configuration of the MOSFET in accordance with the first embodiment in terms of a component described below, and other components are substantially the same as those in the configuration of the MOSFET in accordance with the first embodiment.

Figure 30:
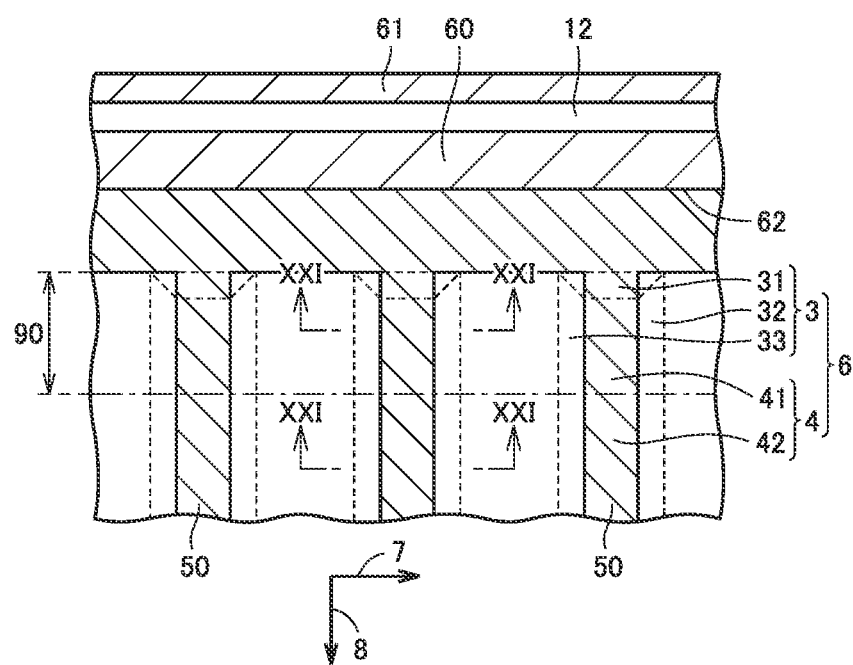
FIG. 30 is a schematic plan view showing a configuration of a silicon carbide semiconductor device in accordance with a fifth embodiment.

As shown in FIG. 30, second impurity region 60 has inner end surface 62 facing the active region. Side surface 3 of gate trench 6 has first outer end surface 31 facing inner end surface 62. Bottom surface 4 has first bottom portion 41 and second bottom portion 42. First bottom portion 41 is continuous to first outer end surface 31. Second bottom portion 42 is continuous to first bottom portion 41, and is located on a side opposite to inner end surface 62 with respect to first bottom portion 41. In direction 7 parallel to first outer end surface 31, a width of first impurity region 50 located between first bottom portion 41 and second main surface 2 may be substantially the same as a width of first impurity region 50 located between second bottom portion 42 and second main surface 2.

The concentration of the p type impurity in first impurity region 50 located between first bottom portion 41 and second main surface 2 is higher than the concentration of the p type impurity in first impurity region 50 located between second bottom portion 42 and second main surface 2. Desirably, the concentration of the p type impurity in first impurity region 50 located between first bottom portion 41 and second main surface 2 is higher than the concentration of the p type impurity in first impurity region 50 located between second bottom portion 42 and second main surface 2 by more than or equal to 1.5 times and less than or equal to 50 times.

As shown in FIG. 21, the width of first impurity region 50 located between second bottom portion 42 and second main surface 2 may be substantially the same as a width of second bottom portion 42, or may be smaller than the width of second bottom portion 42. Similarly, the width of first impurity region 50 located between first bottom portion 41 and second main surface 2 may be substantially the same as the width of second bottom portion 42, or may be smaller than the width of second bottom portion 42. Width 90 of first bottom portion 41 in direction 8 perpendicular to inner end surface 62 (see FIG. 30) is more than or equal to 50 for example. Width 90 of first bottom portion 41 in the direction perpendicular to inner end surface 62 may be more than or equal to 100 μm, or may be more than or equal to 150 μm. It should be noted that the MOSFET in accordance with the fifth embodiment can be manufactured by a manufacturing method identical to that for the MOSFET in accordance with the first embodiment.

Next, the function and effect of the MOSFET in accordance with the fifth embodiment will be described.

According to MOSFET 100 in accordance with the fifth embodiment, the concentration of the p type impurity in p type region 50 located between first bottom portion 41 located on the outer peripheral side and second main surface 2 is higher than the concentration of the p type impurity in p type region 50 located between second bottom portion 42 located on the inner peripheral side and second main surface 2. By increasing the concentration of the p type impurity in p type region 50 on the outer peripheral side having a relatively high electric field intensity, electric field concentration in gate trench 6 can be relieved.

It should be noted that, although the above description has been given on the case where the first conductivity type is an n type and the second conductivity type is a p type, the first conductivity type may be a p type and the second conductivity type may be an n type. Further, although the above description has been given on the case where gate trench 6 has a rectangular shape when viewed in plan view, the shape of gate trench 6 is not limited to a rectangle. The shape of gate trench 6 may be a polygon such as a hexagon, or may be a honeycomb shape, for example. Furthermore, although the above description has been given on the case where the silicon carbide semiconductor device is a MOSFET, the silicon carbide semiconductor device is not limited to a MOSFET. The silicon carbide semiconductor device may be, for example, an IGBT (insulated gate bipolar transistor) or the like.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: first main surface; 2: second main surface; 3: side surface; 4: bottom surface; 6: gate trench; 10: silicon carbide substrate; 11: silicon carbide single crystal substrate; 12: drift region; 13: body region; 14: source region; 15: gate insulating film; 16: source electrode; 17: mask; 18: contact region; 19: source wire; 20: drain electrode; 21: first drift region portion; 22: second drift region portion; 24: silicon carbide epitaxial layer; 25: interlayer insulating film; 27: gate electrode; 31: first outer end surface; 35: second outer end surface; 39: third outer end surface; 41: first bottom portion; 42: second bottom portion; 43: third bottom portion; 44: fourth bottom portion; 45: fifth bottom portion; 46: sixth bottom portion; 47: seventh bottom portion; 48: eighth bottom portion; 49: ninth bottom portion; 50: first impurity region (p type region); 51: first region; 52: second region; 53: third region; 54: fourth region; 55: fifth region; 56: sixth region; 60: second impurity region; 61: guard ring; 62: inner end surface; 63: lower JTE; 64: lower guard ring portion; 65: upper JTE; 66: upper guard ring portion; 70: third impurity region; 92: gate pad; 93: gate runner; 94: first side end surface; 95: second side end surface; 96: second short edge; 97: first short edge; 100: silicon carbide semiconductor device (MOSFET); 101: active region; 102: termination region.

The invention claimed is:

1. A silicon carbide semiconductor device comprising:
   a silicon carbide substrate having a first main surface, and a second main surface located on a side opposite to the first main surface; and a gate insulating film provided on the first main surface,
the silicon carbide substrate including an active region, and a termination region surrounding the active region when viewed from a direction perpendicular to the first main surface,
the active region being provided with at least one gate trench defined by a side surface continuous to the first main surface and a bottom surface continuous to the side surface,
the active region having
 a drift region having a first conductivity type,
 a body region provided on the drift region and having a second conductivity type different from the first conductivity type,
 a source region located on the body region, separated from the drift region by the body region, and having the first conductivity type, and
 a first impurity region located between a plane including the bottom surface and the second main surface, and having the second conductivity type,
the termination region including a second impurity region surrounding the active region when viewed from the direction perpendicular to the first main surface, and having the second conductivity type,
the gate insulating film being in contact with the drift region, the body region, and the source region at the side surface, and being in contact with the drift region at the bottom surface,
the side surface having a first outer end surface facing an inner end surface of the second impurity region,
the bottom surface having a first bottom portion continuous to the first outer end surface, and a second bottom portion continuous to the first bottom portion and located on a side opposite to the inner end surface with respect to the first bottom portion,
the first impurity region having a first region and a second region located between the at least one gate trench and the second main surface, and spaced from each other with the drift region being sandwiched therebetween,
in a direction parallel to the first outer end surface, a spacing between the first region and the second region located between the first bottom portion and the second main surface being smaller than a spacing between the first region and the second region located between the second bottom portion and the second main surface.

2. The silicon carbide semiconductor device according to claim 1, wherein a width of the first bottom portion in a direction perpendicular to the inner end surface is more than or equal to 50 μm.

3. The silicon carbide semiconductor device according to claim 2, wherein the width of the first bottom portion in the direction perpendicular to the inner end surface is more than or equal to 100 μm.

4. The silicon carbide semiconductor device according to claim 3, wherein the width of the first bottom portion in the direction perpendicular to the inner end surface is more than or equal to 150 μm.

5. The silicon carbide semiconductor device according to claim 1, further comprising a gate pad located on the active region, wherein
 the side surface has a second outer end surface facing a first side end surface of the gate pad,
 the bottom surface has a third bottom portion continuous to the second outer end surface, and a fourth bottom portion continuous to the third bottom portion and located on a side opposite to the first side end surface with respect to the third bottom portion,
 the first impurity region has a third region and a fourth region located between the at least one gate trench and the second main surface, and spaced from each other with the drift region being sandwiched therebetween, and
 in a direction parallel to the second outer end surface, a spacing between the third region and the fourth region located between the third bottom portion and the second main surface is smaller than a spacing between the third region and the fourth region located between the fourth bottom portion and the second main surface.

6. The silicon carbide semiconductor device according to claim 5, further comprising a gate runner electrically connected with the gate pad, wherein
 the side surface has a third outer end surface facing a second side end surface of the gate runner,
 the bottom surface has a fifth bottom portion continuous to the third outer end surface, and a sixth bottom portion continuous to the fifth bottom portion and located on a side opposite to the second side end surface with respect to the fifth bottom portion,
 the first impurity region has a fifth region and a sixth region located between the at least one gate trench and the second main surface, and spaced from each other with the drift region being sandwiched therebetween, and
 in a direction parallel to the third outer end surface, a spacing between the fifth region and the sixth region located between the fifth bottom portion and the second main surface is smaller than a spacing between the fifth region and the sixth region located between the sixth bottom portion and the second main surface.

7. The silicon carbide semiconductor device according to claim 1, wherein
 the at least one gate trench includes a plurality of gate trenches,
 each of the plurality of gate trenches has the bottom surface having a rectangular shape,
 the bottom surface has a first short edge, a second short edge located on a side opposite to the first short edge, a seventh bottom portion continuous to the first short edge, an eighth bottom portion continuous to the seventh bottom portion, and a ninth bottom portion continuous to both the eighth bottom portion and the second short edge, and
 in a direction parallel to the first short edge, a spacing between the first region and the second region located between the seventh bottom portion and the second main surface, and a spacing between the first region and the second region located between the ninth bottom portion and the second main surface are smaller than a spacing between the first region and the second region located between the eighth bottom portion and the second main surface.

8. The silicon carbide semiconductor device according to claim 1, wherein
 the active region further has a third impurity region located between the bottom surface and the second main surface to face the bottom surface, and having the second conductivity type, and
 in the direction parallel to the first outer end surface, a width of the third impurity region located between the first bottom portion and the second main surface is larger than a width of the third impurity region located between the second bottom portion and the second main surface.

9. A silicon carbide semiconductor device comprising:
a silicon carbide substrate having a first main surface, and a second main surface located on a side opposite to the first main surface; and
a gate insulating film provided on the first main surface,
the silicon carbide substrate including an active region, and a termination region surrounding the active region when viewed from a direction perpendicular to the first main surface,
the active region being provided with at least one gate trench defined by a side surface continuous to the first main surface and a bottom surface continuous to the side surface,
the active region having
a drift region having a first conductivity type,
a body region provided on the drift region and having a second conductivity type different from the first conductivity type,
a source region located on the body region, separated from the drift region by the body region, and having the first conductivity type, and
a first impurity region located between the bottom surface and the second main surface to face the bottom surface, and having the second conductivity type,
the termination region including a second impurity region surrounding the active region when viewed from the direction perpendicular to the first main surface, and having the second conductivity type,
the gate insulating film being in contact with the drift region, the body region, and the source region at the side surface, and being in contact with the drift region at the bottom surface,
the side surface having a first outer end surface facing an inner end surface of the second impurity region,
the bottom surface having a first bottom portion continuous to the first outer end surface, and a second bottom portion continuous to the first bottom portion and located on a side opposite to the inner end surface with respect to the first bottom portion,
in a direction parallel to the first outer end surface, a width of the first impurity region located between the first bottom portion and the second main surface being larger than a width of the first impurity region located between the second bottom portion and the second main surface.

10. The silicon carbide semiconductor device according to claim 9, wherein the first impurity region is in contact with the bottom surface.

11. The silicon carbide semiconductor device according to claim 9, wherein a width of the first bottom portion in a direction perpendicular to the inner end surface is more than or equal to 50 μm.

12. The silicon carbide semiconductor device according to claim 11, wherein the width of the first bottom portion in the direction perpendicular to the inner end surface is more than or equal to 100 μm.

13. The silicon carbide semiconductor device according to claim 12, wherein the width of the first bottom portion in the direction perpendicular to the inner end surface is more than or equal to 150 μm.

14. The silicon carbide semiconductor device according to claim 9, further comprising a gate pad located on the active region, wherein
the side surface has a second outer end surface facing a first side end surface of the gate pad,
the bottom surface has a third bottom portion continuous to the second outer end surface, and a fourth bottom portion continuous to the third bottom portion and located on a side opposite to the first side end surface with respect to the third bottom portion, and
in a direction parallel to the second outer end surface, a width of the first impurity region located between the third bottom portion and the second main surface is larger than a width of the first impurity region located between the fourth bottom portion and the second main surface.

15. The silicon carbide semiconductor device according to claim 14, further comprising a gate runner electrically connected with the gate pad, wherein
the side surface has a third outer end surface facing a second side end surface of the gate runner,
the bottom surface has a fifth bottom portion continuous to the third outer end surface, and a sixth bottom portion continuous to the fifth bottom portion and located on a side opposite to the second side end surface with respect to the fifth bottom portion, and
in a direction parallel to the third outer end surface, a width of the first impurity region located between the fifth bottom portion and the second main surface is larger than a width of the first impurity region located between the sixth bottom portion and the second main surface.

16. The silicon carbide semiconductor device according to claim 9, wherein
the at least one gate trench includes a plurality of gate trenches,
each of the plurality of gate trenches has the bottom surface having a rectangular shape,
the bottom surface has a first short edge, a second short edge located on a side opposite to the first short edge, a seventh bottom portion continuous to the first short edge, an eighth bottom portion continuous to the seventh bottom portion, and a ninth bottom portion continuous to both the eighth bottom portion and the second short edge, and
in a direction parallel to the first short edge, a width of the first impurity region located between the seventh bottom portion and the second main surface, and a width of the first impurity region located between the ninth bottom portion and the second main surface are larger than a width of the first impurity region located between the eighth bottom portion and the second main surface.

* * * * *